United States Patent [19]

Suda

[11] Patent Number: 5,731,617

[45] Date of Patent: Mar. 24, 1998

[54] SEMICONDUCTOR DEVICE HAVING BIPOLAR TRANSISTOR AND FIELD EFFECT TRANSISTOR

[75] Inventor: Kakutaro Suda, Hyogo, Japan

[73] Assignee: Mitsubishi Denki Kabushiki Kaisha, Tokyo, Japan

[21] Appl. No.: 581,887

[22] Filed: Jan. 2, 1996

Related U.S. Application Data

[63] Continuation of Ser. No. 273,174, Jul. 26, 1994, abandoned.

[30] Foreign Application Priority Data

Dec. 9, 1993 [JP] Japan ................................ 5-309362

[51] Int. Cl.$^6$ .......................... H01L 29/76; H01L 29/94
[52] U.S. Cl. ............................................ 257/370; 257/378
[58] Field of Search .................................. 257/587, 588, 257/592, 370, 371, 378

[56] References Cited

U.S. PATENT DOCUMENTS

| 4,669,177 | 6/1987 | D'Arrigo et al. | 257/587 |
|---|---|---|---|
| 4,780,427 | 10/1988 | Sakai et al. | 257/378 |
| 4,892,837 | 1/1990 | Kudo | 257/588 |
| 4,931,407 | 6/1990 | Maeda et al. | 437/15 |
| 5,005,066 | 4/1991 | Chen | 257/370 |
| 5,124,271 | 6/1992 | Havemann | 437/15 |
| 5,150,184 | 9/1992 | Eklund | 257/588 |
| 5,212,398 | 5/1993 | Matsunaga et al. | 257/378 |
| 5,286,986 | 2/1994 | Kihara et al. | 257/370 |
| 5,294,823 | 3/1994 | Eklund et al. | 257/588 |

FOREIGN PATENT DOCUMENTS

| 3-51310 | 8/1991 | Japan. |
|---|---|---|
| 4-188628 | 7/1992 | Japan. |
| 4-346263 | 12/1992 | Japan. |

*Primary Examiner*—Wael Fahmy
*Attorney, Agent, or Firm*—Lowe, Price, LeBlanc & Becker

[57] ABSTRACT

A semiconductor device with a reduced insulating capacitance between an emitter electrode and a base layer, and a manufacturing method thereof are disclosed. In the semiconductor device, at least first and second insulating layers are interposed between the emitter electrode and the base layer. Preferably, the first insulating layer, a semiconductor layer having insulation characteristics, and the second insulating layer are interposed between the emitter electrode and the base layer.

16 Claims, 45 Drawing Sheets

SEMICONDUCTOR DEVICE HAVING BIPOLAR TRANSISTOR AND FIELD EFFECT TRANSISTOR

This application is a continuation of application Ser. No. 08/273,174 filed Jul. 26, 1994 now abandoned.

BACKGROUND OF THE INVENTION

1. Field of the Invention

The present invention relates to semiconductor devices and a method of manufacturing the same, and more particularly to a semiconductor device having a Bi-CMOS element and a method of manufacturing the same.

2. Description of the Background Art

Conventionally, a Bi-CMOS element is known as one which combines high speed characteristics of a bipolar element and high integration characteristics and low power consumption characteristics of a CMOS element.

FIG. 33 is a cross sectional view showing a semiconductor device having a conventional Bi-CMOS element. Referring to FIG. 33, in the semiconductor device having the conventional Bi-CMOS element, an N-channel MOS transistor, a P-channel MOS transistor, and an NPN bipolar transistor are formed adjacent to each other on a P$^-$ type semiconductor substrate 101. Element isolation regions are provided between the N-channel MOS transistor and the P-channel MOS transistor, and between the P-channel MOS transistor and the NPN bipolar transistor, respectively.

In the N-channel transistor region, a P$^+$ type buried layer 103 is formed on P$^-$ type semiconductor substrate 101. A P-type well 107 is formed on P$^+$ type buried layer 103. On a main surface of P type well 107, N$^+$ type source/drain regions 115a and 115b are formed with a prescribed space so as to sandwich a channel region. On the channel region sides of N$^+$ type source/drain regions 115a and 115b, N$^-$ type source/drain regions 112a and 112b are formed, respectively. On the channel region a lower polycrystalline silicon film 118c is formed with a gate oxide film 117c interposed therebetween. An upper polycrystalline silicon film 119c is formed on lower polycrystalline silicon 118c. Lower polycrystalline silicon film 118c and upper polycrystalline silicon film 119c constitute a gate electrode. Sidewall oxide films 120c are formed on both side surfaces of lower polycrystalline silicon film 118c and upper polycrystalline silicon film 119c.

In the P-channel MOS transistor region, an N$^+$ type buried layer 102 is formed on P$^-$ type semiconductor substrate 101. An N-well 106 is formed on N$^+$ buried layer 102. On a main surface of an N-well 106 P$^+$ type source/drain regions 114a and 114b are formed with a prescribed space so as to sandwich a channel region. P$^-$ type source/drain regions 111a and 111b are formed respectively on the channel region sides of P$^+$ type source/drain regions 114a and 114b. On the channel region a lower polycrystalline silicon film 118b formed with a gate oxide film 117b interposed therebetween. An upper polycrystalline silicon film 119b is formed on lower polycrystalline silicon film 118b. Lower polycrystalline silicon film 118b and upper polycrystalline silicon film 119b constitute a gate electrode. Sidewall oxide films 120b are formed on both side surfaces of lower polycrystalline silicon film 118b and upper polycrystalline silicon film 119b.

In the NPN bipolar transistor region, N$^+$ type buried layer 102 is formed on P$^-$ type semiconductor substrate 101. An N$^-$ type epitaxial layer 104 is formed on N$^+$ type buried layer 102. In a prescribed region of N$^-$ type epitaxial layer 102, an N$^+$ type collector electrode drawing-out layer 108 is formed extending from its surface down to N$^+$ type buried layer 102. On a main surface of N$^-$ type epitaxial layer 104, a P-type base layer 109 and a P$^+$ external base layer 113 are formed with a prescribed space from N$^+$ type collector electrode drawing-out layer 108. An N$^+$ type emitter layer 110 is formed in a prescribed region on a main surface of P type base layer 109. A gate oxide film 117a having an opening on N$^+$ type emitter layer 110 is formed in a prescribed region on P type base layer 109. A lower polycrystalline silicon film 118a is formed on gate oxide film 117a. An upper polycrystalline silicon film 119a is formed electrically connected to N$^+$ type emitter layer 110, and extending on and along an upper surface of lower polycrystalline silicon film 118a. Lower polycrystalline silicon film 118a and upper polycrystalline silicon film 119a constitute an emitter electrode. A sidewall oxide film 120a is formed on a sidewall portion of lower polycrystalline silicon film 118a and upper polycrystalline silicon film 119a. An isolation oxide film 116 is formed between N$^+$ type collector electrode drawing-out layer 108 and P$^+$ type external base layer 113.

In the element isolation region between the transistors, isolation oxide film 116, a P$^+$ type element isolation layer 105, and P$^+$ type buried layer 103 are formed. A surface protection oxide film 121 is formed to cover the whole surface. A contact hole is formed in a region corresponding to an electrode formation region of surface protection oxide film 121. A collector electrode wiring 122, a base electrode wiring 123, an emitter electrode wiring 124, a source/drain electrode wiring 125 of the P-channel MOS transistor, a gate electrode wiring, not shown, of the P-channel MOS transistor, a source/drain electrode wiring 126 of the N-channel MOS transistor, and a gate electrode wiring, not shown, of the N-channel MOS transistor are respectively formed to bury the corresponding contact holes.

Gate oxide films 117a, 117b and 117c are formed to have a thickness of approximately 10 nm, respectively. Lower polycrystalline silicon films 118a, 118b, and 118c are formed to have a thickness of approximately 20–70 nm, respectively. Upper polycrystalline silicon films 119a, 119b and 119c are formed to have a thickness of approximately 150–200 nm, respectively. Surface protection oxide film 121 is formed to have a thickness of approximately 1000 nm.

FIGS. 34 to 39 are sectional views showing a method of manufacturing the semiconductor device including the conventional Bi-CMOS element shown in FIG. 33. The method of manufacturing the semiconductor device including the conventional Bi-CMOS element will now be described with reference to FIGS. 34 to 39.

Initially, as shown in FIG. 34, after arsenic (As) or antimony (Sb) is ion-implanted into the bipolar transistor formation region and the P-channel MOS transistor formation region on P$^-$ type semiconductor substrate 101, heat treatment is carried out, so that N$^+$ type buried layer 102 is formed. After boron (B) is ion-implanted into the N-channel MOS transistor formation region and the element isolation region, heat treatment is carried out, so that P$^+$ type buried layer 103 is formed. N$^-$ type epitaxial layer 104 is formed all over the surface. Isolation oxide films 116 are formed in the element isolation regions and the collector-base isolation region of the bipolar transistor, with a LOCOS (LOCal Oxidation of Silicon) method.

The collector electrode formation region of the bipolar transistor is subjected to solid phase diffusion with phosphorus (P) to form N$^+$ type collector electrode drawing-out layer 108. After boron (B) is ion-implanted through isolation oxide film 116 in the element isolation region, heat treatment is carried out, so that P⁺ type element isolation layer 105 is formed.

After phosphorus (P) is ion-implanted into the P-channel MOS transistor region, heat treatment is carried out, so that N-type well 106 is formed. After boron (B) is ion-implanted into the N-channel MOS transistor region, heat treatment is carried out, so that P-type well 107 is formed.

As shown in FIG. 35, after boron (B) is ion-implanted into N⁻ type epitaxial layer 104 of the bipolar transistor region, heat treatment is carried out, so that P-type base layer 109 is formed.

As shown in FIG. 36, thermal oxidation is performed all over the surface to form gate oxide layer 117 having a thickness of approximately 10 nm. Lower polycrystalline silicon layer 118 having the thickness of approximately 20–70 nm is formed on gate oxide layer 117 by a CVD method. A photoresist 151 is formed in a prescribed region on lower polycrystalline silicon layer 118. Lower polycrystalline silicon layer 118 and gate oxide layer 117 in the emitter formation region of the bipolar transistor are anisotropically etched with photoresist 151 as a mask. Thereafter, photoresist 151 is removed.

As shown in FIG. 37, upper polycrystalline silicon layer 119 having the thickness of approximately 150–200 nm is formed all over the surface by a CVD method. After arsenic (As) is ion-implanted into upper polycrystalline silicon layer 119 and lower polycrystalline silicon layer 118, heat treatment is carried out, so that arsenic is diffused uniformly into upper polycrystalline silicon layer 119 and lower polycrystalline silicon layer 118, and electrically activated. N⁺ type emitter layer 110 is thus formed. The ion-implantation of arsenic into upper polycrystalline silicon layer 119 and lower polycrystalline silicon layer 118 is performed under conditions where arsenic ions should not attain gate oxide layer 117.

Lower polycrystalline silicon layer 118 serves as a protection film for gate oxide layer 117 when removing photoresist 151 at the step shown in FIG. 36.

After a photoresist 152 as shown in FIG. 38 is formed in a prescribed region on the upper polycrystalline silicon layer, upper polycrystalline silicon 119 (see FIG. 37) and lower polycrystalline silicon layer 118 (see FIG. 37) are anisotropically etched with photoresist 152 as a mask. As a result, as shown in FIG. 38, lower polycrystalline silicon films 118a, 118b, and 118c and upper polycrystalline silicon films 119a, 119b, and 119c, that is, an emitter electrode constituted of lower polycrystalline silicon film 118a and upper polycrystalline silicon film 119a, a gate electrode constituted of lower polycrystalline silicon film 118b and upper polycrystalline silicon film 119b, and a gate electrode constituted of lower polycrystalline silicon film 118c and upper polycrystalline silicon film 119c are formed. Thereafter, photoresist 152 is removed.

As shown in FIG. 39, a photoresist 153 is formed to cover a region other than the P-channel MOS transistor region. Boron (B) is ion-implanted at a low concentration into the P-channel MOS transistor region is photoresist 153 as a mask, so as to form P⁻ type source/drain regions 111a and 111b. Thereafter, photoresist 153 is removed.

As shown in FIG. 40, a photoresist 154 is formed to cover a region other than the N-channel MOS transistor region. Phosphorus (P) is ion-implanted at a low concentration into the N-channel MOS transistor region with photoresist 154 as a mask, so as to form N⁻ type source/drain regions 112a and 112b. Thereafter, photoresist 154 is removed.

As shown in FIG. 41, after oxide film 120 is formed on the whole surface by a CVD method, the whole surface is subjected to anisotropic etching, so that sidewall oxide films 120a, 120b, and 120c and gate oxide films 117a, 117b, and 117c are formed, as shown in FIG. 42.

As shown in FIG. 43, a photoresist 155 is formed to cover a region other than the P-channel MOS transistor region and an external base region of the bipolar transistor. Boron (B) is ion-implanted at a high concentration with photoresist 155 as a mask, so as to form P⁺ type external base layer 113 and P⁺ type source/drain regions 114a and 114b. Thereafter, photoresist 155 is removed.

As shown in FIG. 44, a photoresist 156 is formed to cover a region other than the N-channel MOS transistor region. Arsenic (As) is ion-implanted at a high concentration with photoresist 156 as a mask, to form N⁺type source/drain regions 115a and 115b. Thereafter, photoresist 156 is removed. Impurities are electrically activated by heat treatment in P⁻ type source/drain regions 111a and 111b, P⁺ type source/drain regions 114a and 114b, N⁻ type source/drain regions 112a and 112b, N⁺ type source/drain regions 115a and 115b, and P⁺ external base layer 113. The P-channel MOS transistor and the N-channel MOS transistor each having an LDD structure, and the NPN bipolar transistor are thus completed.

Finally, as shown in FIG. 33, surface protection oxide film 121 having the thickness of approximately 1000 nm is formed all over the surface by a CVD method. A contact hole is formed in a prescribed region of surface protection oxide film 121. After depositing low resistance metal, such as Al, in the contact hole by a sputtering method, pattering is performed to form collector electrode wiring 122, base electrode wiring 123 and emitter electrode wiring 124 of the bipolar transistor, source/drain electrode wirings 125 of the P-channel MOS transistor, source/drain electrode wirings 126 of the N-channel MOS transistor, and gate electrode wirings, not shown, of the P-channel MOS transistor and the N-channel MOS transistor. The semiconductor device having the conventional Bi-CMOS element shown in FIG. 33 is thus formed.

In the method of manufacturing the semiconductor device including the conventional Bi-CMOS element described above, the gate oxide films (117b, 117c) of the MOS transistors and the gate oxide film (117a) of the NPN transistor are formed simultaneously, as well as the gate electrodes (118b, 119b, 118c, 119c) of the MOS transistors and the emitter electrodes (118a, 119a) of the bipolar transistor are formed simultaneously, aiming to simplification of the manufacturing process.

Description will now be made on a parasitic capacitance of a conventional bipolar transistor with reference to FIG. 45. An emitter-base parasitic capacitance Cte of the bipolar transistor is the sum of a junction capacitance $Cte_1$ of N⁺ type emitter layer 110 and P-type base layer 109 and an insulation capacitance $Cte_2$ of an oxide film 200 insulating an emitter electrode 201 and P-type base layer 109 ($Cte = Cte_1 + Cte_2$).

In the bipolar transistor portion of the conventional Bi-CMOS shown in FIG. 33, gate oxide film 117a whose thickness is the same as those of gate oxide films 117b and 117c of the MOS transistor portions corresponds to oxide film 200 of FIG. 45. Gate oxide films 117b and 117c are formed to have a very small thickness of approximately 10 nm for enhancing performance of the MOS transistors. Therefore, the gate oxide film 117a is also made to have a very small thickness of approximately 10 nm.

The insulation capacitance $Cte_2$ is inversely proportional to the thickness of oxide film 200 (gate oxide film 117a). In other words, the smaller the thickness of gate oxide film 117a becomes, the larger the insulation capacitance $Cte_2$ grows. Accordingly, in the conventional Bi-CMOS structure, the insulation capacitance $Cte_2$ of the bipolar transistor portion becomes too large, resulting in disadvantageous increase of the emitter-base parasitic capacitance Cte. This leads to decrease of operational speed of the bipolar transistor portion in the Bi-CMOS structure. Such decrease of operational speed on account of increase of the emitter-base parasitic capacitance Cte is disclosed, for example, in Physics of Semiconductor Devices—SECOND EDITION—S. M. Sze, 1981, pp. 158–159. The above problem is peculiar to the Bi-CMOS structure requiring simultaneous formation of the MOS transistor portion and the NPN transistor portion for simplification of the manufacturing process. Ctc shown in FIG. 45 indicates a base-collector capacitance.

SUMMARY OF THE INVENTION

One object of the present invention is to effectively prevent decrease of operational speed in a semiconductor device.

Another object of the present invention is to reduce an emitter-base parasitic capacitance in a semiconductor device.

Still another object of the present invention is to form readily a semiconductor device capable of reducing an emitter-base parasitic capacitance, in a method of manufacturing a semiconductor device.

In one aspect of the present invention, a semiconductor device includes a collector layer of a first conductivity type, a base layer of a second conductivity type, an emitter layer of the first conductivity type, a first insulating layer, a semiconductor layer, a second insulating layer, and an emitter electrode. The collector layer having a main surface. The base layer is formed in a prescribed region on the main surface of the collector layer. The emitter layer is formed in a prescribed region on a main surface of the base layer. The first insulating layer is formed at least in a prescribed region on the base layer, and has an opening on the emitter layer. The semiconductor layer is formed on the first insulating layer. The second insulating layer is formed on an upper surface and a side surface of the semiconductor layer. The emitter electrode is formed electrically connected to the emitter layer in the opening of the first insulating layer, and extending on and along the surface of the second insulating layer.

In the semiconductor device, since the first insulating layer, the semiconductor layer and the second insulating layer are interposed between the emitter electrode and the base layer, the insulation capacitance between the emitter electrode and the base layer is reduced compared to that with only one insulating layer interposed therebetween as in the conventional case. As a result, the emitter-base parasitic capacitance is made smaller than the conventional one, thereby preventing reduction of operational speed, effectively. Moreover, the insulation capacitance between the base layer and the emitter electrode is further reduced by forming the above semiconductor layer to have insulation characteristics.

In another aspect of the present invention, a semiconductor device includes a collector layer of a first conductivity type, a base layer of a second conductivity type, an emitter layer of the first conductivity type, a first insulating layer, a second insulating layer, and an emitter electrode. The second insulating layer is formed on the first insulating layer. The emitter electrode is formed electrically connected to the emitter layer in an opening of the first insulating layer, and extending on and along an upper surface of the second insulating layer.

In the semiconductor device, since the first insulating layer and the second insulating layer are interposed between the emitter electrode and the base layer, the thickness of the insulating film between the emitter electrode and the base layer is increased compared to that with only one insulating layer interposed therebetween as in the conventional case. Consequently, the insulation capacitance between the emitter electrode and the base layer, and thus, the emitter-base parasitic capacitance are reduced compared to the conventional case, whereby reduction of operational speed is effectively prevented.

In still another aspect of the present invention, a semiconductor device includes complementary field effect transistors and a bipolar transistor. Each of the complementary field effect transistors includes an impurity layer having a main surface, and a gate electrode. The gate electrode is formed on the main surface of the impurity layer with a gate insulating film interposed therebetween. The bipolar transistor includes a collector layer of a first conductivity type, a base layer of a second conductivity type, and an emitter layer of the first conductivity type, a first insulating layer, a semiconductor layer, a second insulating layer, and an emitter electrode. The base layer is formed in a prescribed region on a main surface of the collector layer. The emitter layer is formed in a prescribed region on a main surface of the base layer. The first insulating layer is formed at least in a prescribed region on the base layer. The first insulating layer has an opening on the emitter layer, and has a thickness approximately equal to that of the gate insulating film. The semiconductor layer is formed on the first insulating layer. The second insulating layer is formed on an upper surface and a side surface of the semiconductor layer. The emitter electrode is formed electrically connected to the emitter layer in the opening of the first insulating layer, and extending on and along a surface of the second insulating layer.

In the semiconductor device, since the first insulating layer having the thickness approximately equal to that of the gate insulating film of the complementary field effect transistor, the semiconductor layer, and the second insulating layer are interposed between the emitter electrode and the base layer, the insulation capacitance between the emitter electrode and the base layer is reduced compared to that with only the first insulating layer interposed therebetween as in the conventional case. As a result, the emitter-base parasitic capacitance is also reduced compared to the conventional case, whereby reduction of the operational speed of the bipolar transistor is effectively prevented.

In a further aspect of the present invention, a semiconductor device includes complementary field effect transistors and a bipolar transistor. Each of the complementary field effect transistors includes an impurity layer and a gate electrode. The bipolar transistor includes a collector layer, a base layer, an emitter layer, and a first insulating layer. In this semiconductor device, the bipolar transistor further includes a second insulating layer and an emitter electrode. The second insulating layer is formed on the first insulating layer. The emitter electrode is formed electrically connected to the emitter layer in an opening of the first insulating layer, and extending on and along an upper surface of the second insulating layer.

In the semiconductor device, since the first insulating layer having the thickness approximately equal to that of the gate insulating film of the complementary field effect transistor, and the second insulating layer are interposed between the emitter electrode and the base layer, the insulation capacitance between the emitter electrode and the base layer, and thus, the emitter-base parasitic capacitance are reduced compared to the semiconductor device with only the first insulating layer interposed therebetween as in the conventional case, whereby reduction of the operational speed of the bipolar transistor is effectively prevented.

In a still further aspect of the present invention, a method of manufacturing a semiconductor device includes the steps of: forming a collector layer of a first conductivity type having a main surface; forming a base layer of a second conductivity type in a prescribed region on the main surface of the collector layer; forming a first insulating layer having an opening on the emitter layer, at least in a prescribed region on the base layer; forming a semiconductor layer on the first insulating layer; forming a second insulating layer on an upper surface and a side surface of the semiconductor layer; and forming an emitter electrode electrically connected to the emitter layer in the opening of the first insulating layer, and extending on and along a surface of the second insulating layer.

In the method of manufacturing the semiconductor device, the first insulating layer is formed in a prescribed region on the base layer; the semiconductor layer is formed on the first insulating layer; the second insulating layer is formed on the upper surface of the semiconductor layer; and the emitter electrode is formed on the second insulating layer, whereby a structure is formed where the first insulating layer, the semiconductor layer and the second insulating layer are interposed between the emitter electrode and the base layer. As a result, the insulation capacitance between the emitter electrode and the base layer is reduced compared to that with only one insulating layer interposed between the base layer and the emitter electrode, as in the conventional case, so that the semiconductor device having a small emitter-base parasitic capacitance can be readily manufactured.

In a still further aspect of the present invention, a method of manufacturing a semiconductor device includes the steps of: forming a collector layer of a first conductivity type having a main surface; forming a base layer of a second conductivity type in a prescribed region on the main surface of the collector layer; forming a first insulating layer having an opening on the emitter layer, at least in a prescribed region on the base layer; forming a second insulating layer on the first insulating layer; and forming an emitter electrode electrically connected to the emitter layer in the opening of the first insulating layer, and extending on and along an upper surface of the second insulating layer.

In the method of manufacturing the semiconductor device, the first insulating layer is formed on the base layer; the second insulating layer is formed on the first insulating layer; and the emitter electrode is formed on the second insulating layer, whereby a structure is formed where the first insulating layer and the second insulating layer are interposed between the base layer and the emitter electrode. As a result, the insulation capacitance between the emitter electrode and the base layer is reduced compared to that with only one insulating layer interposed between the base layer and the emitter electrode as in the conventional case, so that the semiconductor device having a small emitter-base parasitic capacitance can be readily manufactured.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
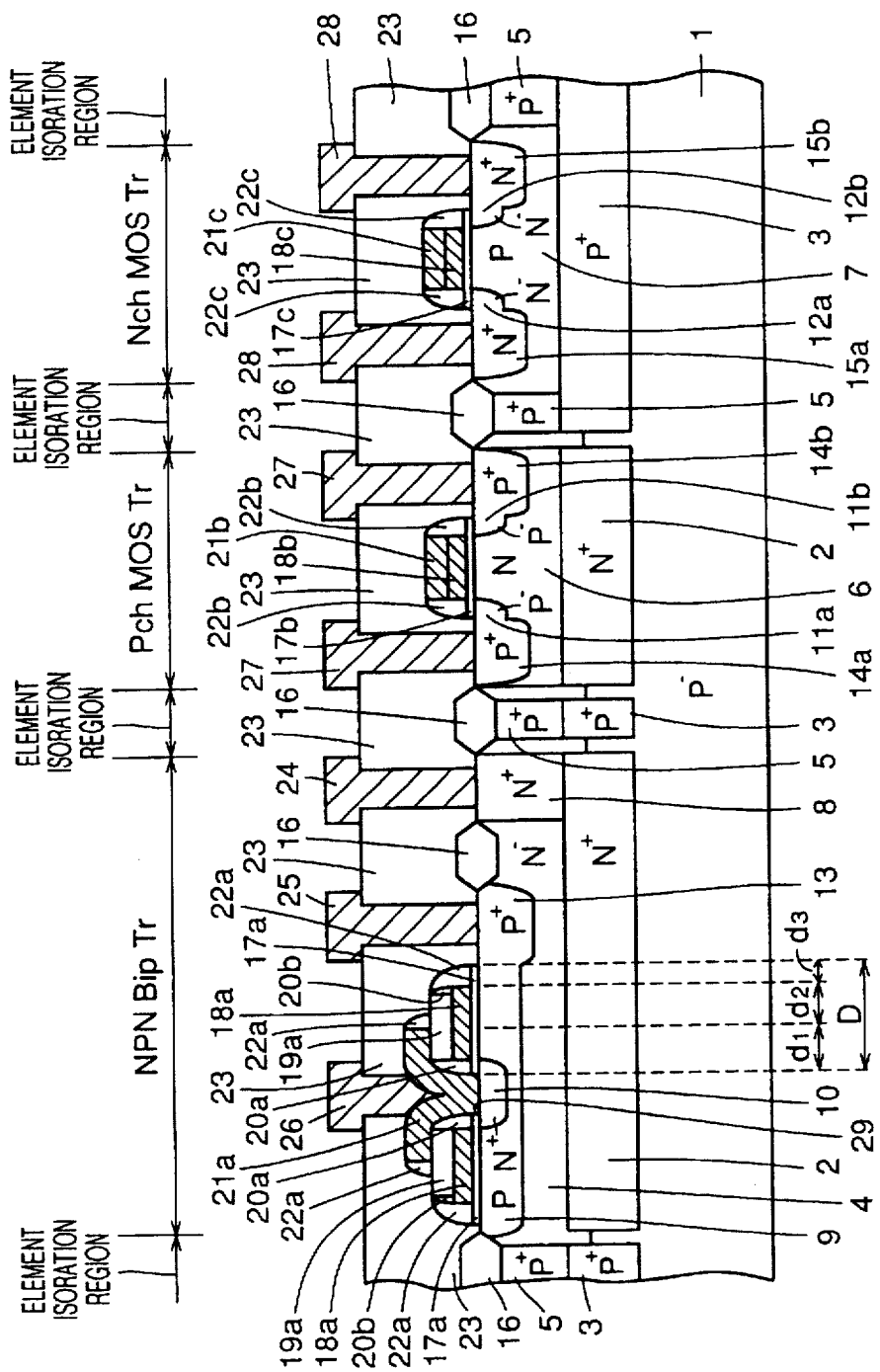
FIG. 1 is a cross sectional view showing a semiconductor device including a Bi-CMOS element in accordance with a first embodiment of the present invention.

Referring to FIG. 1, an N-channel MOS transistor, a P-channel MOS transistor, and an NPN bipolar transistor are formed on a P⁻ type semiconductor substrate in a semiconductor device of a first embodiment. Element isolation regions are provided between the N-channel MOS transistor and the P-channel MOS transistor, and between the P-channel MOS transistor and the NPN bipolar transistor, respectively.

In the N-channel MOS transistor region, a $P^+$ type buried layer 3 is formed on a $P^-$ type semiconductor substrate 1. A P-type well 7 is formed on $P^+$ type buried layer 3. $N^+$ type source/drain regions 15a and 15b are formed with a prescribed space so as to sandwich a channel region on a main surface of P-type well 7. $N^-$ type source/drains regions 12a and 12b are formed on channel region sides of $N^+$ source/drain regions 15a and 15b, respectively. A lower polycrystalline silicon film 18c is formed on the channel region with a gate oxide film 17c interposed therebetween. An upper polycrystalline silicon film 21c is formed on lower polycrystalline silicon film 18c. Lower polycrystalline silicon film 18c and upper polycrystalline silicon film 21c constitute a gate electrode. Sidewall oxide films 22c are formed on both side surfaces of lower polycrystalline silicon film 18c and upper polycrystalline silicon film 21c.

In the P-channel MOS transistor region, an N⁺ type buried layer 2 is formed on P⁻ type semiconductor substrate 1. An N-type well 6 is formed on N⁺ type buried layer 2. P⁺ type source/drain regions 14a and 14b are formed with a prescribed space so as to sandwich a channel region on a main surface of N-type well 6. P⁻ type source/drain regions 11a and 11b are formed on channel region sides of P⁺ type source/drain regions 14a and 14b, respectively. A lower polycrystalline silicon film 18b is formed on the channel region with a gate oxide film 17b interposed therebetween. An upper polycrystalline silicon film 21b is formed on lower polycrystalline silicon film 18b. Lower polycrystalline silicon film 18b and upper polycrystalline silicon film 21b constitute a gate electrode. Sidewall oxide films 22b are formed on both side surfaces of upper polycrystalline silicon film 21b and lower polycrystalline silicon film 18b.

In the NPN bipolar transistor region, N⁺ type buried layer 2 is formed on P⁻ type semiconductor substrate 1. An N⁻ type epitaxial layer 4 is formed on N⁺ type buried layer 2. In a prescribed region of N⁻ type epitaxial layer 4, an N⁺ type collector electrode drawing-out layer 8 is formed extending from its surface down to N⁺ type buried layer 2. A P⁺ type external base layer 13 and a P-type base layer 9 are formed with a prescribed space from N⁺ type collector electrode drawing-out layer 8 on the main surface of N⁻ type epitaxial layer 4. An isolation oxide film 16 is formed between P⁺ type external base layer 13 and the N⁺type collector electrode drawing-out layer. An N⁺ type emitter layer 10 is formed in a prescribed region on the main surface of P-type base layer 9.

In the first embodiment, gate oxide film 17a having an emitter hole above N⁺ type emitter layer 10 is formed on P-type base layer 9 and N⁺ type emitter layer 10. A lower polycrystalline silicon film 18a having insulation characteristics is formed on gate oxide film 17a. An oxide film 19a is formed on the upper surface of lower polycrystalline silicon film 18a.

Sidewall oxide films 20a are formed on one side surface of oxide film 19a and one side surface of lower polycrystalline silicon film 18a. Sidewall oxide films 20b are formed on the other side surfaces of oxide film 19a and lower polycrystalline silicon film 18a. An upper polycrystalline silicon film 21a constituting an emitter electrode is formed electrically connected to N⁺ type emitter layer 10 in the emitter hole of gate oxide film 17a, and extending on and along the surface of sidewall oxide film 20a and oxide film 19a. Sidewall oxide films 22a are formed on both side surfaces of upper polycrystalline silicon film 21a, and on the other side surface of lower polycrystalline silicon film 18a and the surface of sidewall oxide film 20b.

A surface protection oxide film 23 is formed to have the thickness of approximately 1000 nm and to cover the whole surface. A plurality of contact holes are formed in prescribed regions on surface protection oxide film 23. Source/drain electrode wirings 28 and a gate electrode wiring, not shown, of the N-channel MOS transistor are formed in the contact holes. Source/drain electrode wirings 27 and a gate electrode wiring, not shown, of the P-channel MOS transistor are formed in the contact holes. A collector electrode wiring 24, a base electrode wiring 25, and an emitter electrode wiring 26 of the bipolar transistor are formed in the contact holes.

Gate oxide film 17a of the NPN bipolar transistor and gate oxide films 17b and 17c of the MOS transistors are formed in the identical step, so as to have the same thickness of approximately 10 nm. Lower polycrystalline silicon film 18a of the NPN bipolar transistor and lower polycrystalline silicon films 18b and 18c of the MOS transistors are formed in the identical step, so as to have the same thickness of 20–70 nm. Upper polycrystalline silicon film 21a of the NPN bipolar transistor and upper polycrystalline silicon films 21b and 21c of the MOS transistors are formed in the identical step, so as to have the same thickness of 150–200 nm. Oxide film 19a of the NPN bipolar transistor region has the thickness of approximately 100–150 nm.

Figure 33:
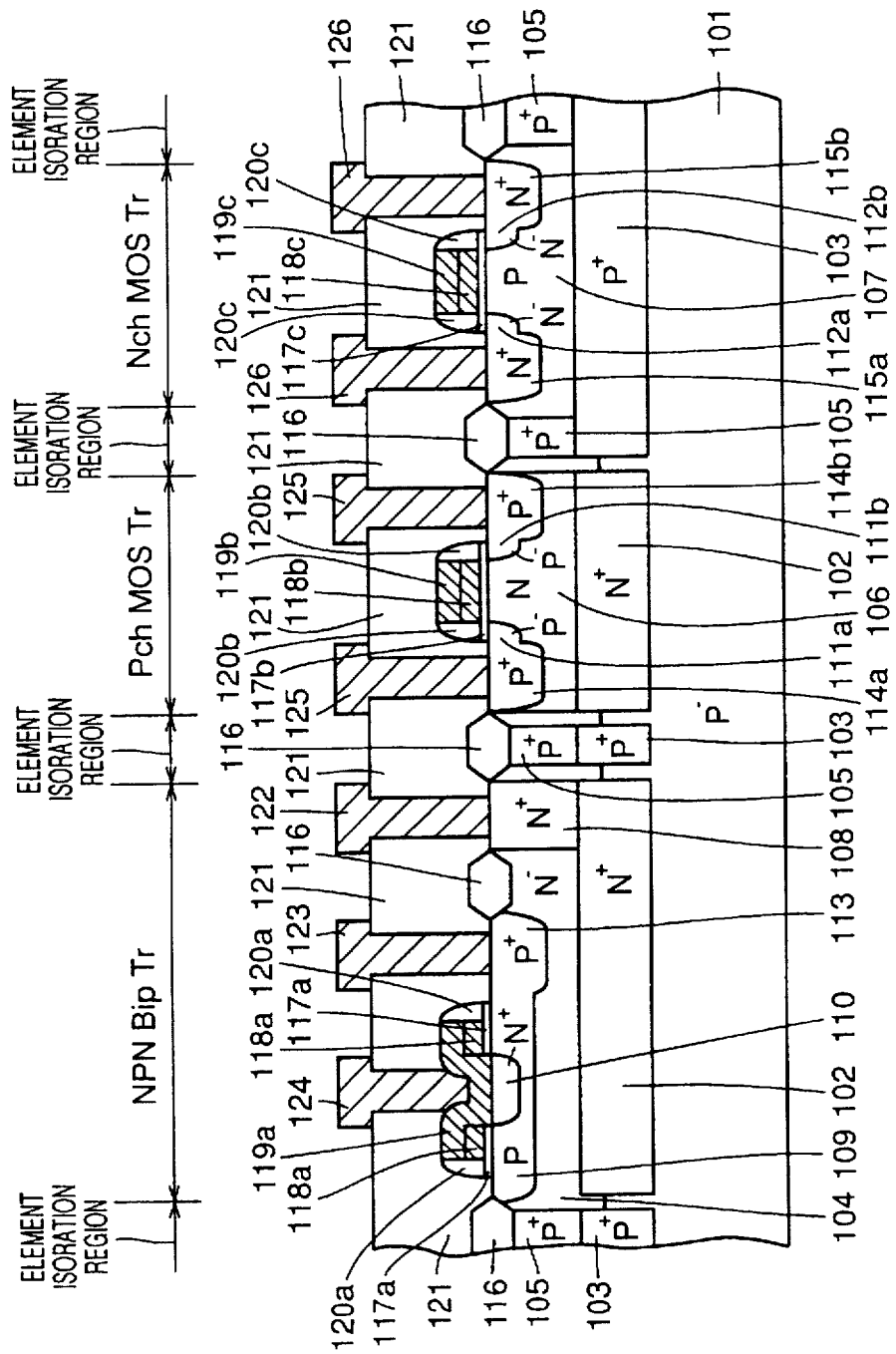
FIG. 33 is a cross sectional view showing a conventional semiconductor device including a Bi-CMOS element.
Figure 34:
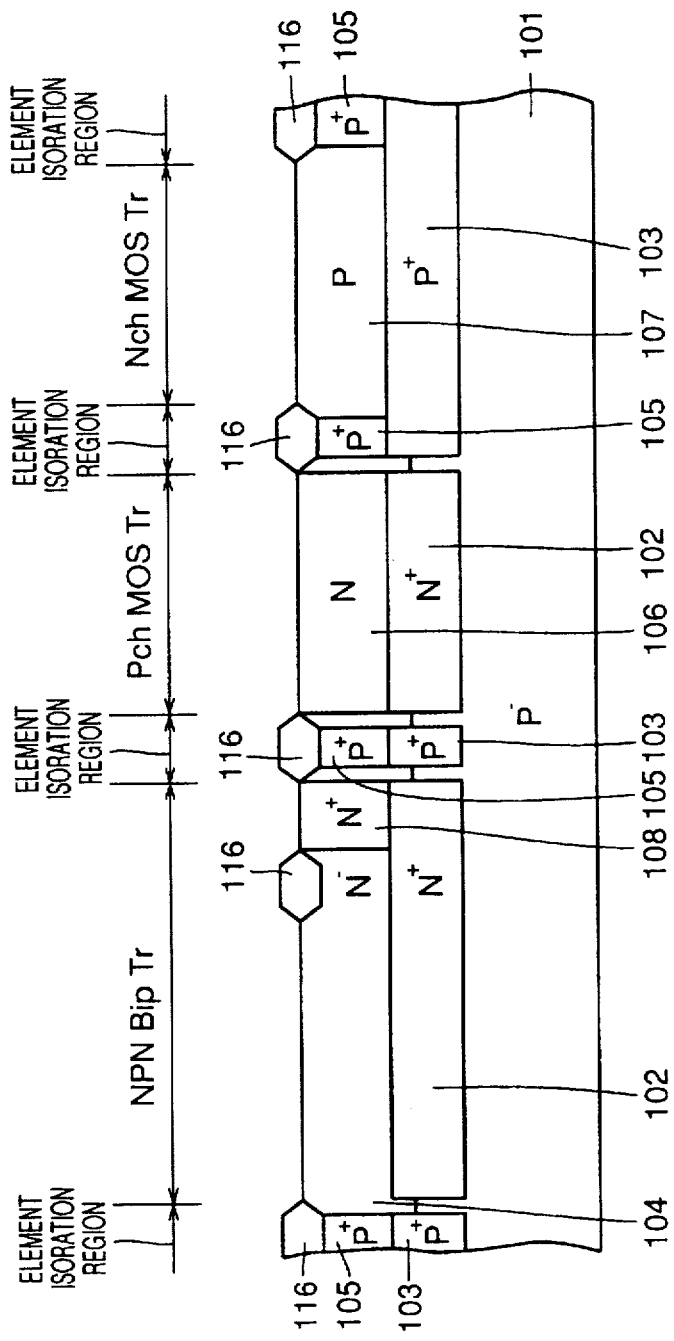
FIGS. 34 to 44 are cross sectional views showing the first to eleventh steps of a manufacturing process of the conventional semiconductor device shown in FIG. 33.
Figure 35:
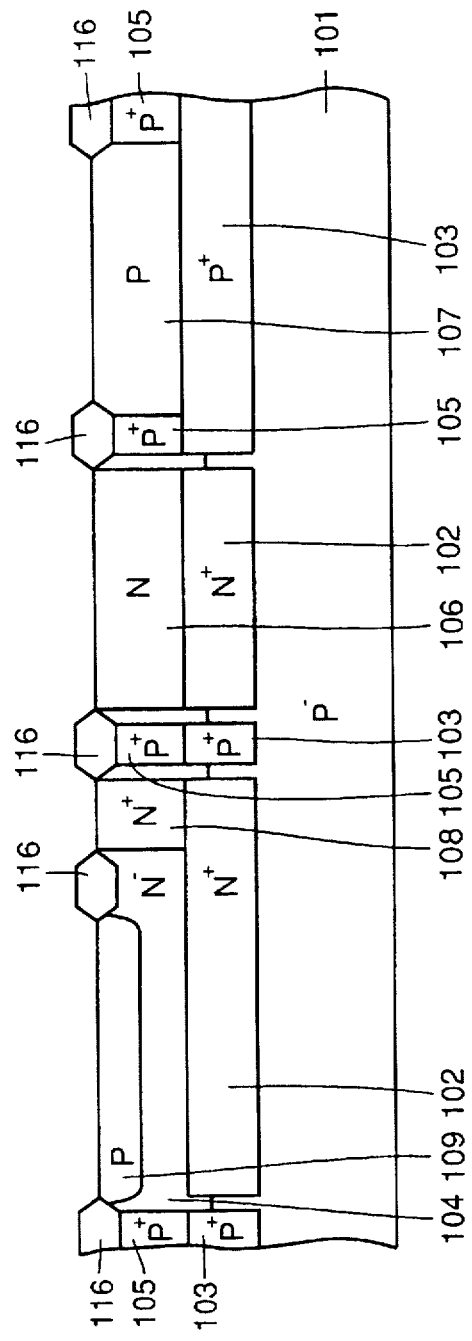
Figure 36:
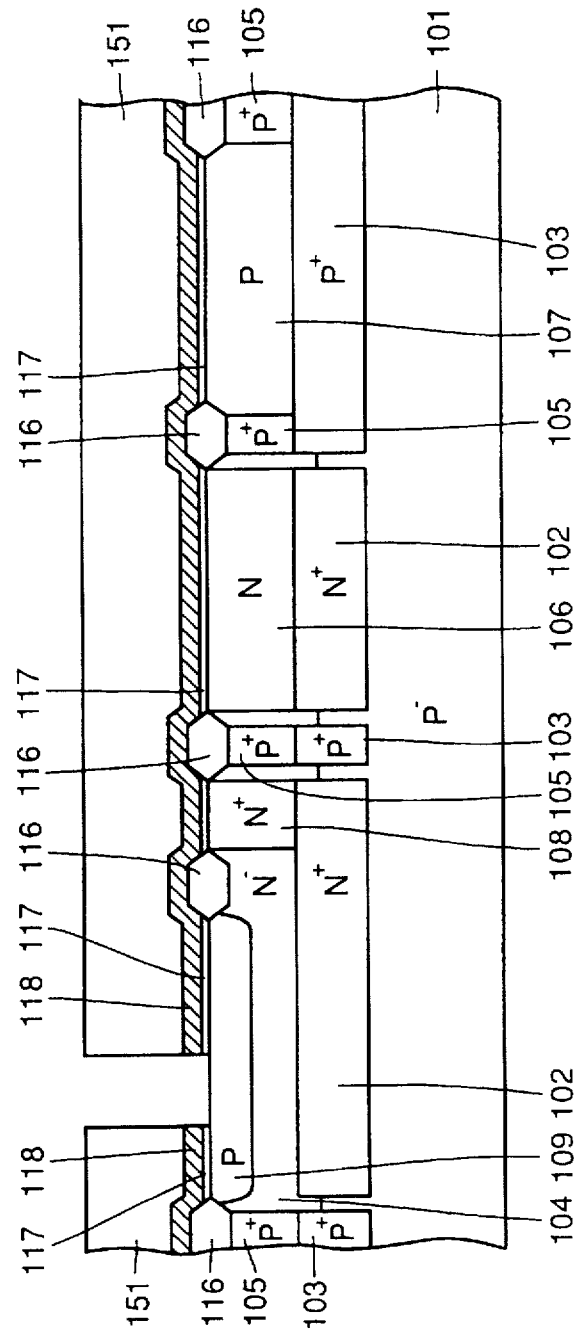
Figure 37:
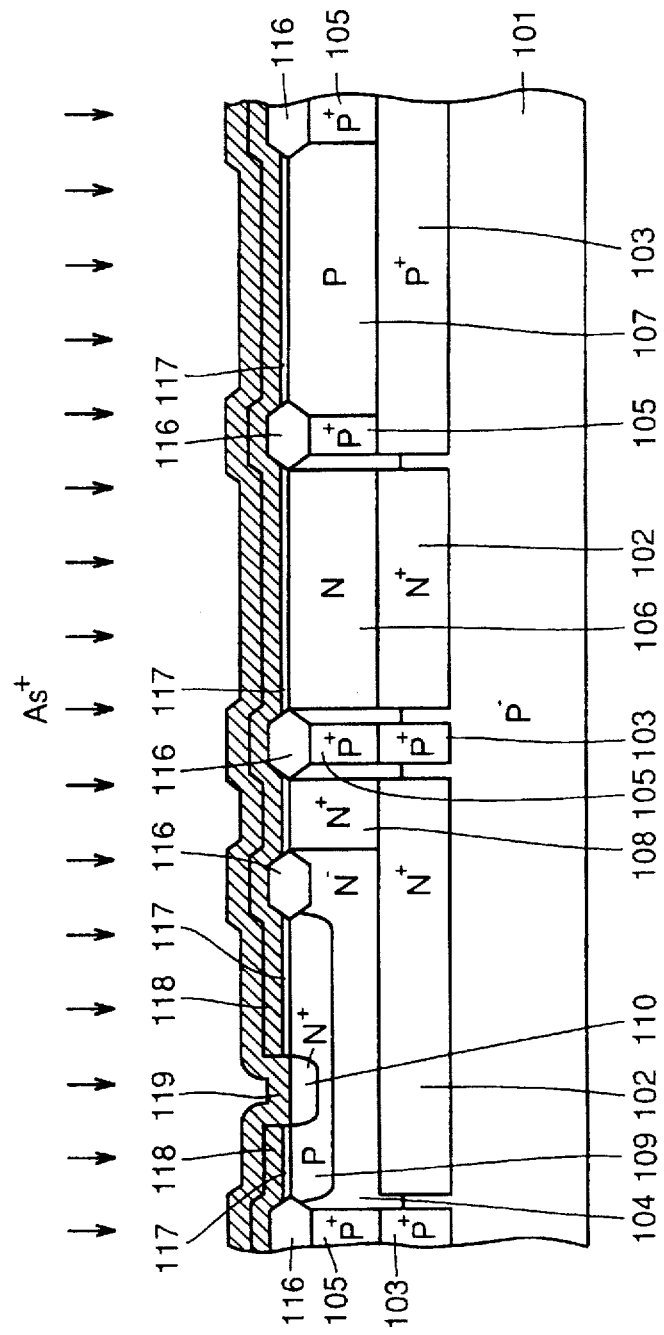
Figure 38:
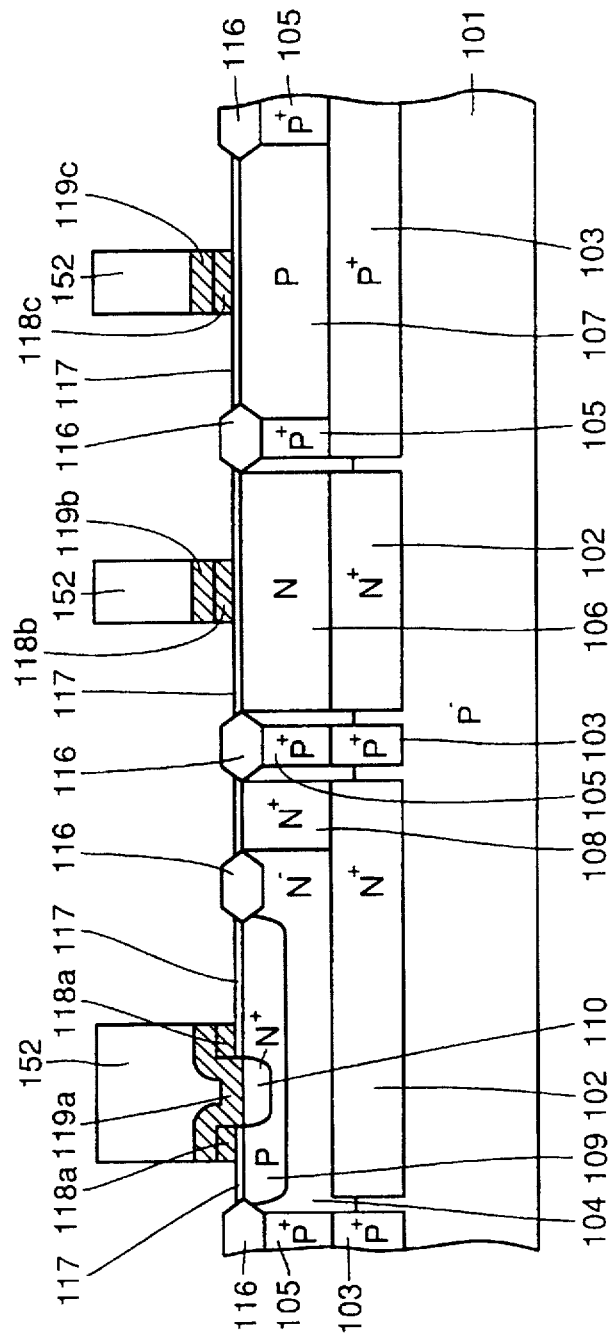
Figure 39:
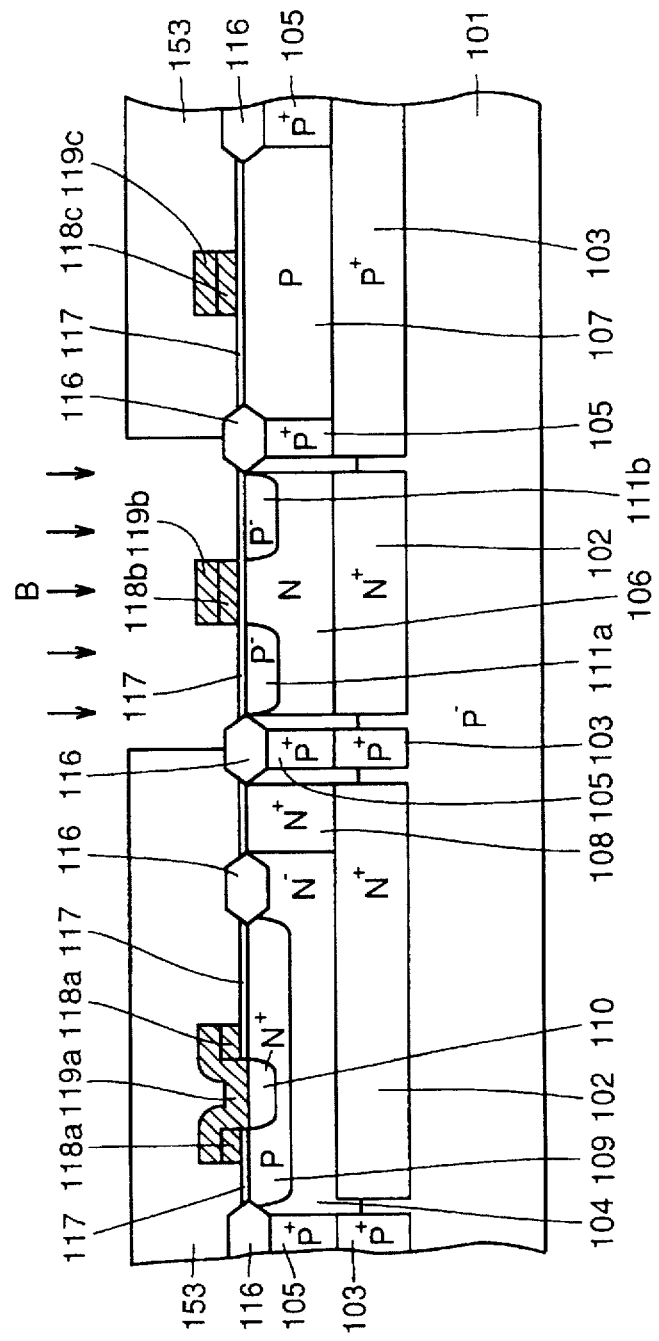
Figure 40:
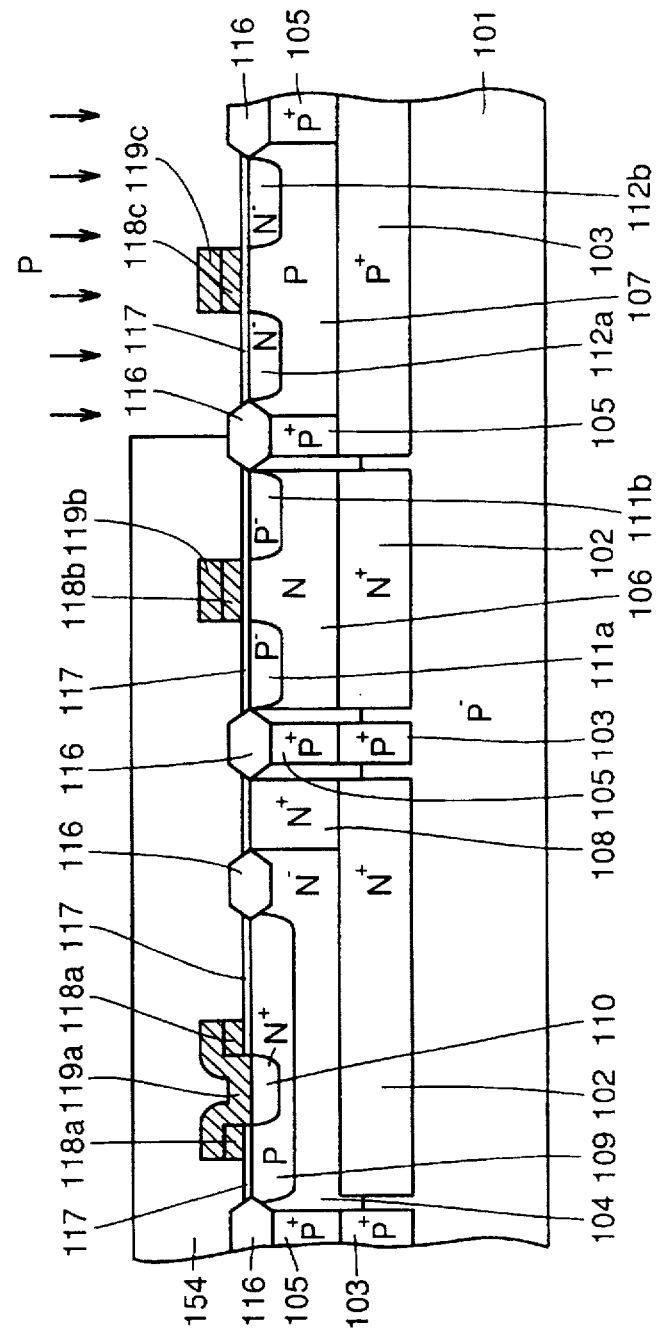
Figure 41:
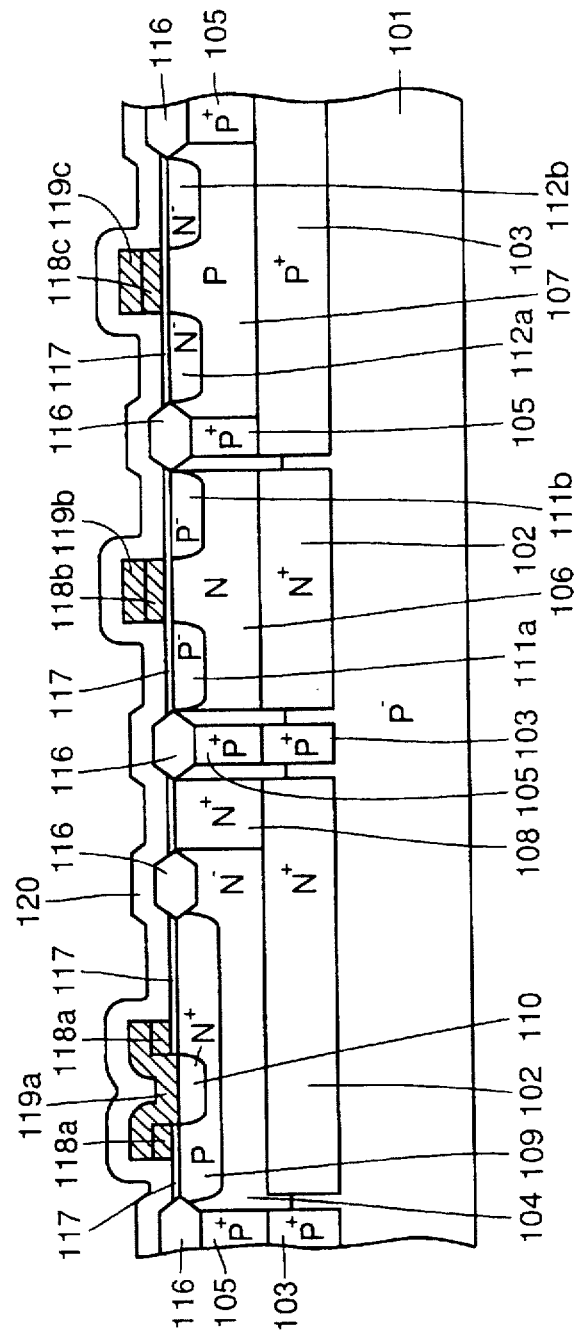
Figure 42:
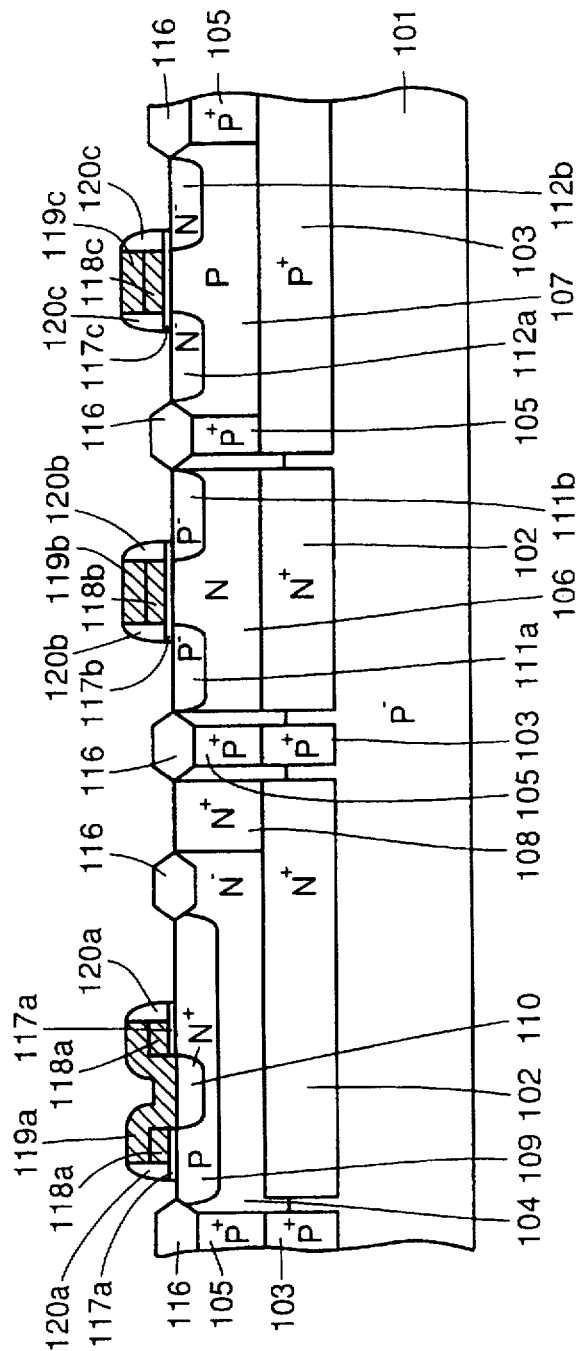
Figure 43:
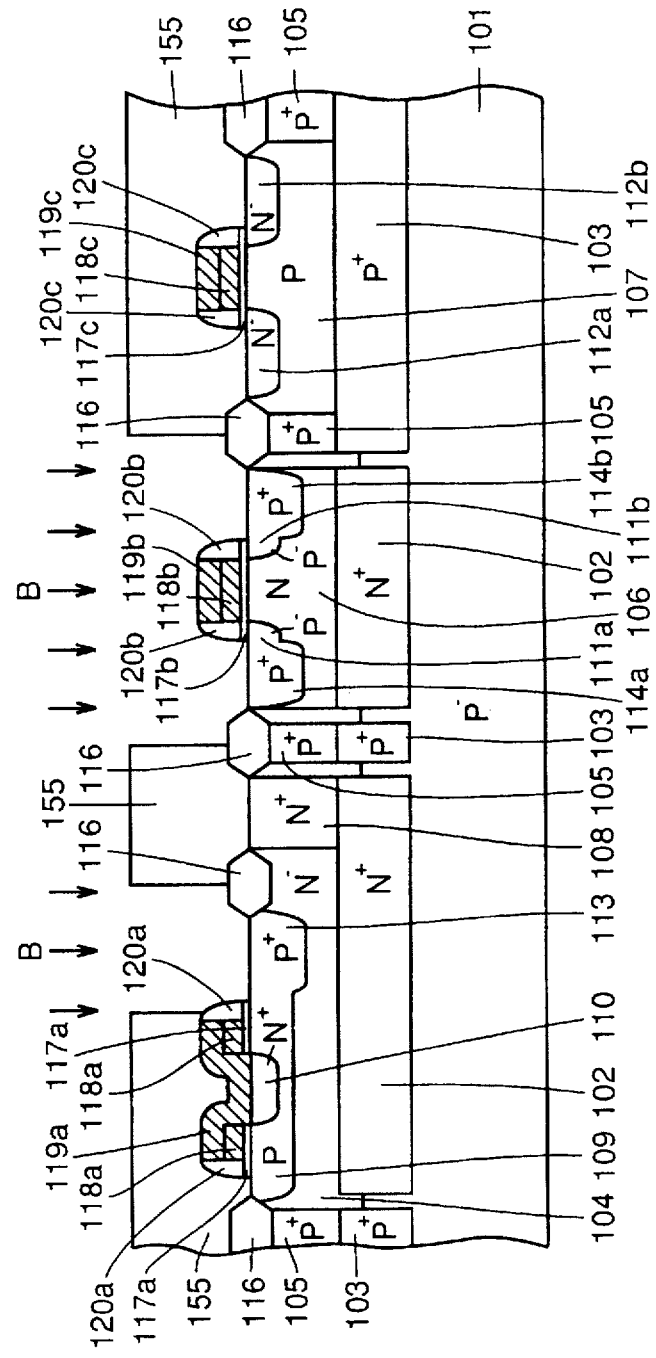
Figure 44:
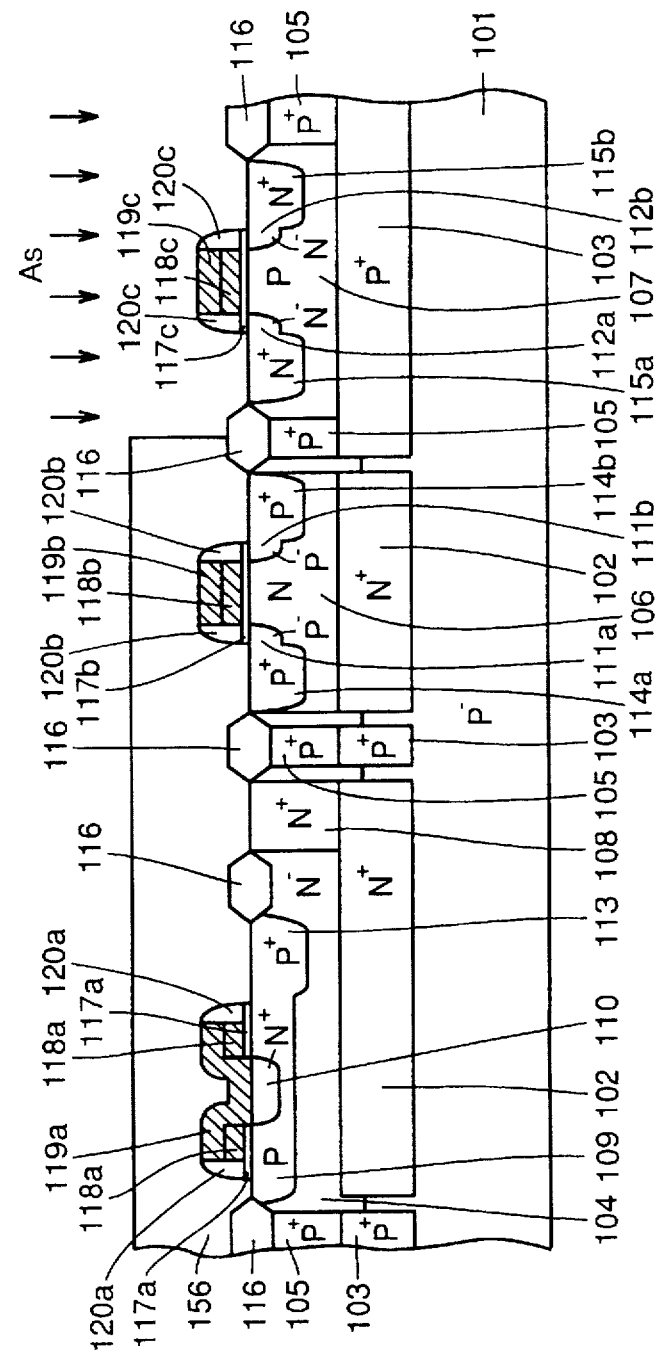
Figure 45:
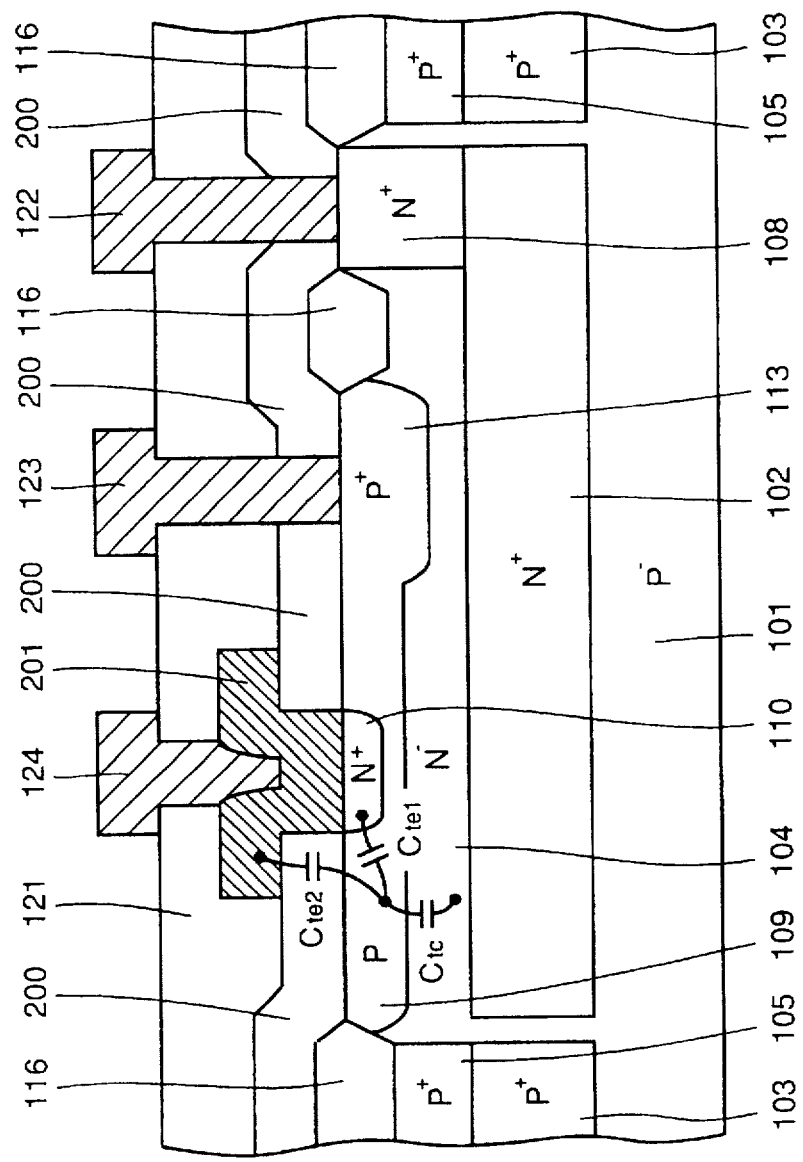
FIG. 45 is a cross sectional view showing a parasitic capacitance Cte between the emitter and the base.

In this embodiment, gate oxide film 17a, lower polycrystalline silicon film 18a having isolation characteristics, oxide film 19a and sidewall oxide film 20a are interposed between P-type base layer 9 and upper polycrystalline silicon film 21a constituting the emitter electrode. Accordingly, upper polycrystalline silicon film 21a and P-type base layer 9 are isolated by gate oxide film 17a, lower polycrystalline silicon film 18a, and sidewall oxide film 20a or oxide film 19a. Consequently, the insulation capacitance between upper polycrystalline silicon film 21a and P-type base layer 9 is reduced compared to that in the conventional structure where lower polycrystalline silicon film (emitter electrode) 118a and P-type base layer 109 are isolated only by gate oxide film 117a shown in FIG. 33, so that the emitter-base parasitic capacitance is reduced. As a result, reduction of the operational speed of the bipolar transistor can be effectively prevented. In order to have insulation characteristics, lower polycrystalline silicon film 18a should be formed with no impurity or a slight amount of impurities.

Taking into account only of the insulation capacitance, the larger thickness of lower polycrystalline silicon film 18a and oxide film 19a is better. When the thickness of lower polycrystalline silicon film 18a and oxide film 19a is increased too much, however, a step disadvantageously becomes too large. Accordingly, it is preferable for the sum of the thicknesses of gate oxide film 17a, lower polycrystalline silicon film 18a, and oxide film 19a to be not more than 200 nm, approximately.

Description will be now made on the manufacturing process of the semiconductor device in accordance with the first embodiment with reference to FIGS. 1 to 16.

Figure 2:
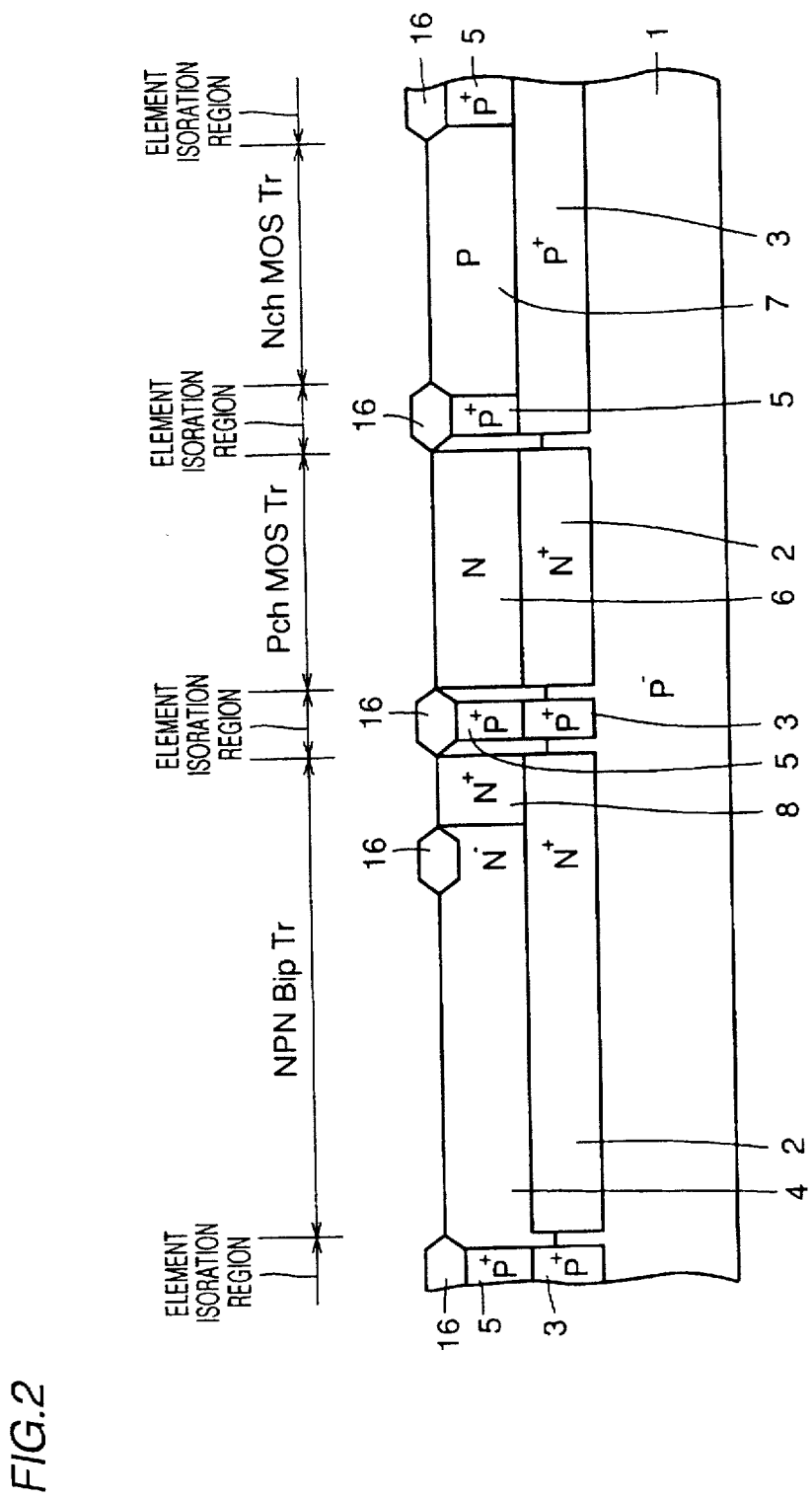
FIGS. 2 to 16 are cross sectional views showing the first to fifteenth steps of a manufacturing process of the semiconductor device in accordance with the first embodiment shown in FIG. 1.

As shown in FIG. 2, the bipolar transistor formation region and the P-channel MOS transistor formation region on P⁻ type semiconductor substrate 1 are subjected to ion-implantation of arsenic (As) or antimony (Sb), and heat-treated to form N-type buried layer 2. The N-channel MOS transistor region and the element isolation region on P⁻ type semiconductor substrate 1 are subjected to ion-implantation of boron (B), and heat-treated to form P⁺ type buried layer 3.

N⁻ type epitaxial layer 4 is formed all over the surface. Isolation oxide films 16 are formed in the element isolation regions and the collector/base isolation regions on the main surface of epitaxial layer 4 with a LOCOS method. N⁺ type collector electrode drawing-out layer 8 is formed in the collector electrode formation region of the bipolar transistor by solid phase diffusion of phosphorus (P). N⁻ type epitaxial layer 4 is subjected to ion-implantation of boron (B) through isolation oxide film 16 in the element isolation region, and heat-treated to form P⁺ type element isolation layer 5.

The P-channel MOS transistor region is subjected to ion-implantation of phosphorus (P), and heat-treated to form N-type well 6. The N-channel MOS transistor region is subjected to ion-implantation of boron (B), and heat-treated to form P-type well 7.

Figure 3:
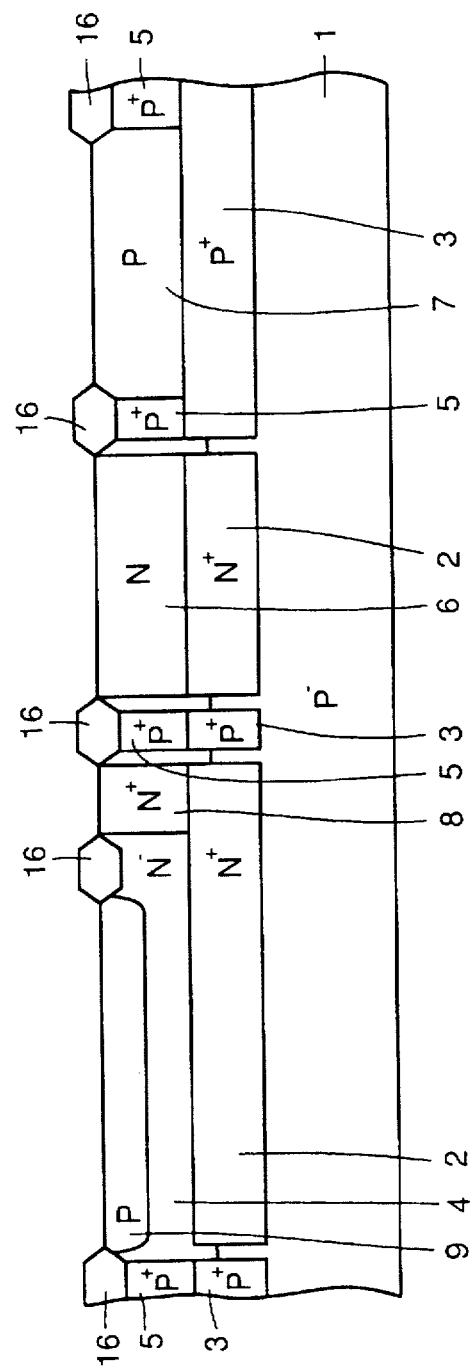

As shown in FIG. 3, a prescribed region on the main surface of N⁻ type epitaxial layer 4 is subjected to ion-implantation of boron (B), and heat-treated to form P-type base layer 9.

Figure 4:
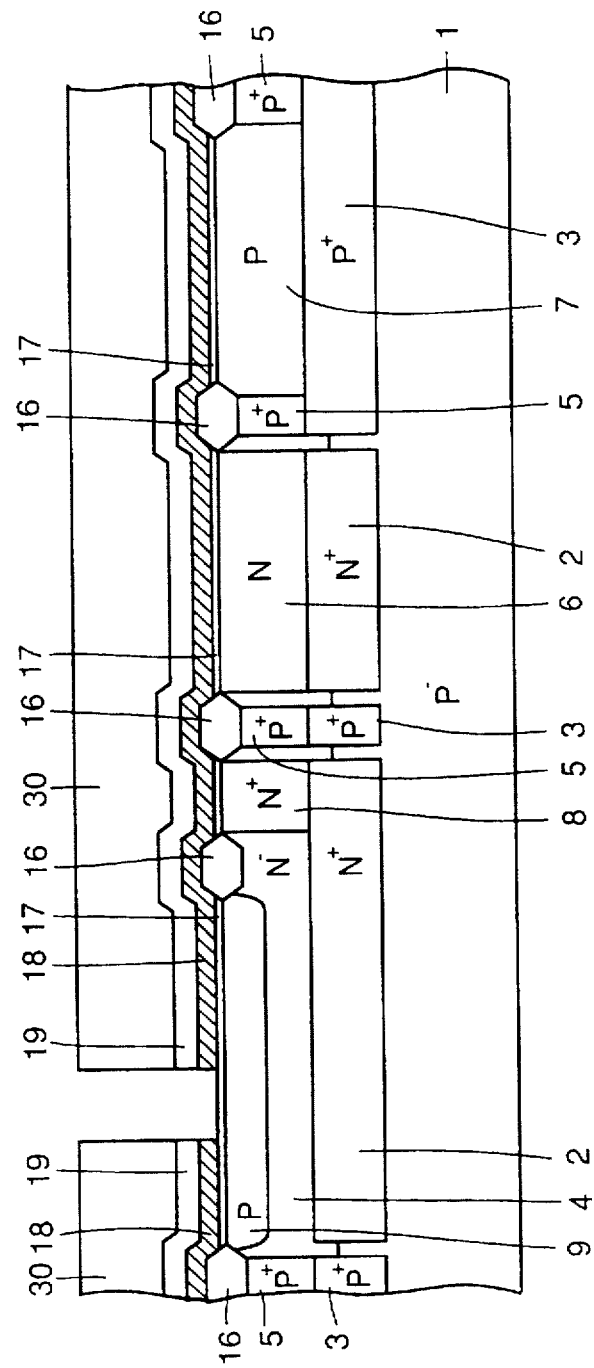

As shown in FIG. 4, a gate oxide layer 17 having the thickness of approximately 10 nm is formed all over the surface with a thermal oxidation method. A lower polycrystalline silicon layer 18 having the thickness of approximately 20–70 nm is formed on gate oxide layer 17 with a CVD method. An oxide layer 19 having the thickness of approximately 100–150 nm is formed on lower polycrystalline silicon film layer 18. A photoresist 30 is formed in a prescribed region on oxide layer 19. Oxide layer 19 and lower polycrystalline silicon layer 18 are anisotropically etched with photoresist 30 as a mask. Thereafter, photoresist 30 is removed.

Figure 5:
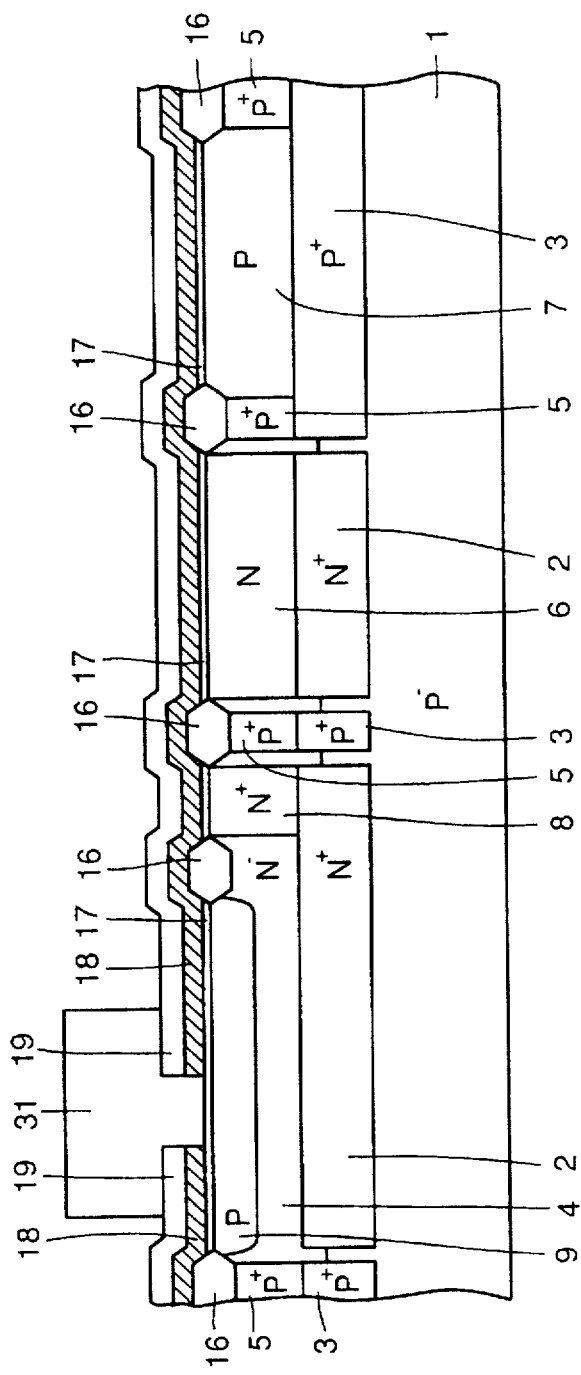
Figure 6:
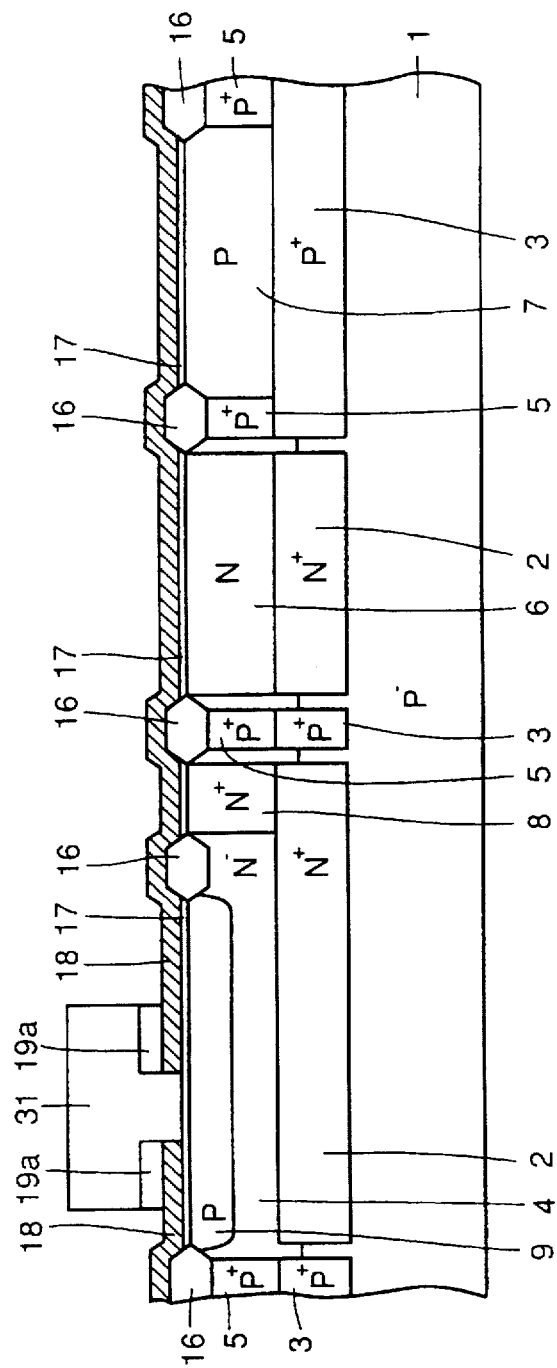

As shown in FIG. 5, a photoresist 31 is formed in a prescribed region. Oxide layer 19 is anisotropically etched with photoresist 31 as a mask, to form oxide film 19a as shown in FIG. 6. Lower polycrystalline silicon layer 18 serves as a protection film for gate oxide layer 17 in anisotropic etching of oxide layer 19 (see FIG. 5).

Figure 7:
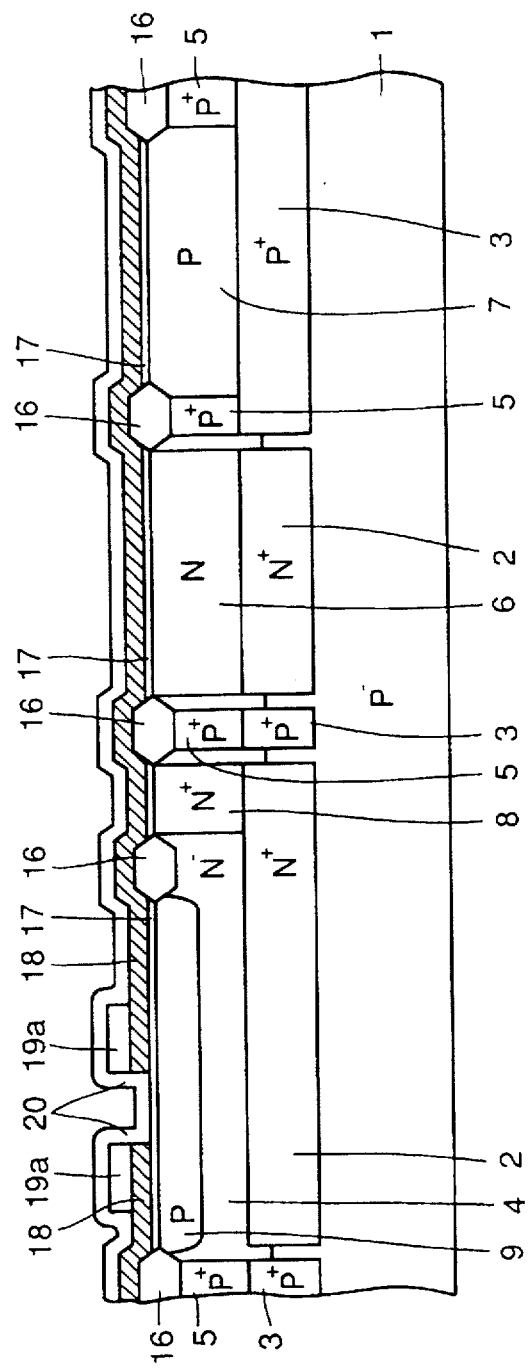
Figure 8:
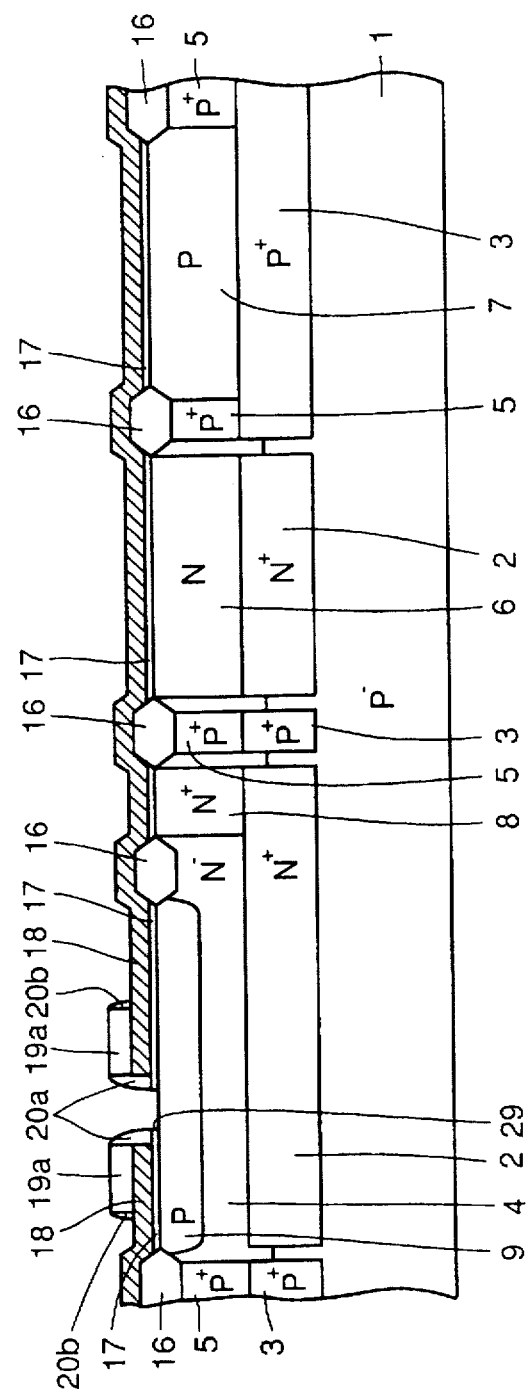

As shown in FIG. 7, after forming an oxide layer 20 having a thickness of approximately 100–150 nm all over the surface, the whole surface is etched back, so that sidewall oxide films 20a and 20b are formed as shown in FIG. 8. Subsequently, gate oxide layer 17 is etched away to form an emitter hole 29.

Figure 9:
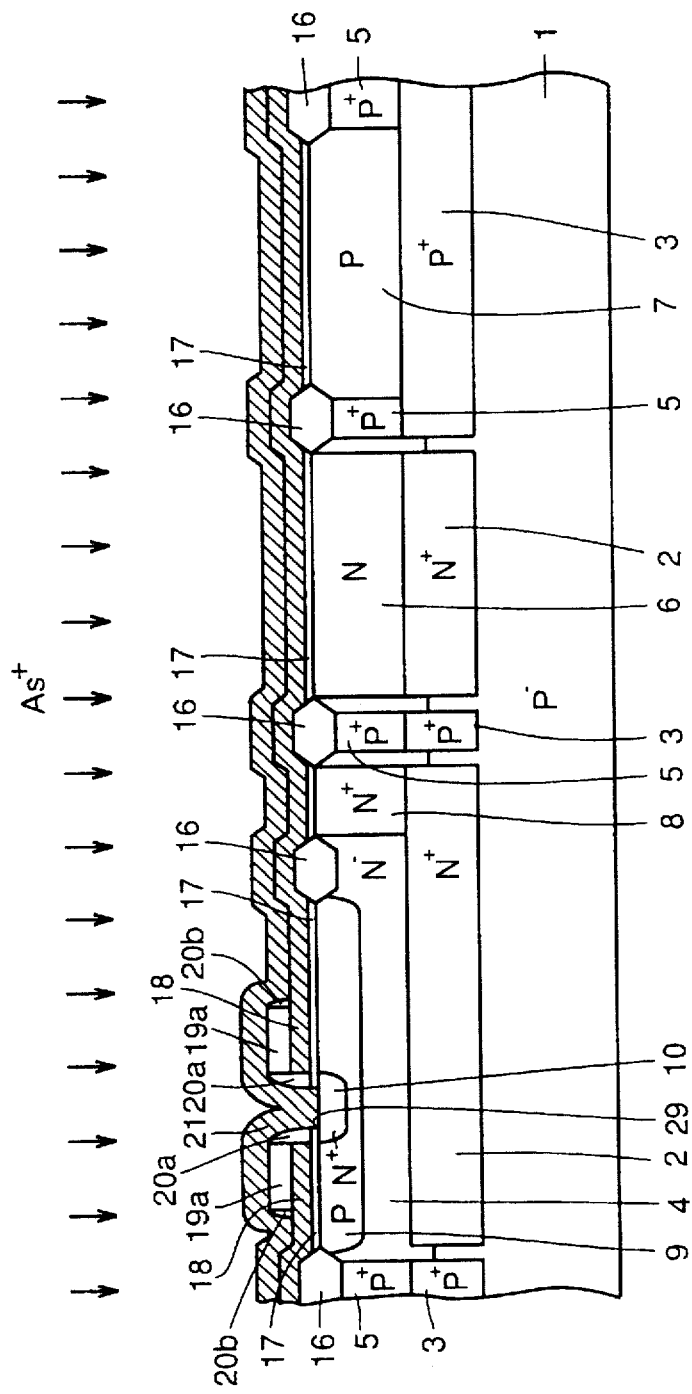

As shown in FIG. 9, an upper polycrystalline silicon layer 21 having the thickness of approximately 150–200 nm is formed all over the surface with a CVD method. Upper polycrystalline silicon layer 21 and lower polycrystalline silicon layer 18 are subjected to ion-implantation of arsenic (As), and heat-treated, so that arsenic (As) within upper polycrystalline silicon layer 21 is diffused in the surface region of P-type base layer 9 through emitter hole 29, whereby $N^+$ type emitter layer 10 is formed.

Oxide film 19a serves as a barrier in ion-implantation of arsenic (As) into lower polycrystalline silicon layer 18. Accordingly, arsenic (As) is not or is hardly implanted into the region of lower polycrystalline silicon layer 18 beneath oxide film 19a, whereby the region is rendered almost in an isolated state. Arsenic (As) should be implanted under such conditions that it should not attain gate oxide film 17. When the sum of the thicknesses of lower polycrystalline silicon layer 18 and upper polycrystalline silicon layer 21 is approximately 200 nm, for example, the implantation energy of 50 KeV and the dose of $5-10 \times 10^{15}$ $cm^{-2}$ may be appropriate for the ion-implantation.

Figure 10:
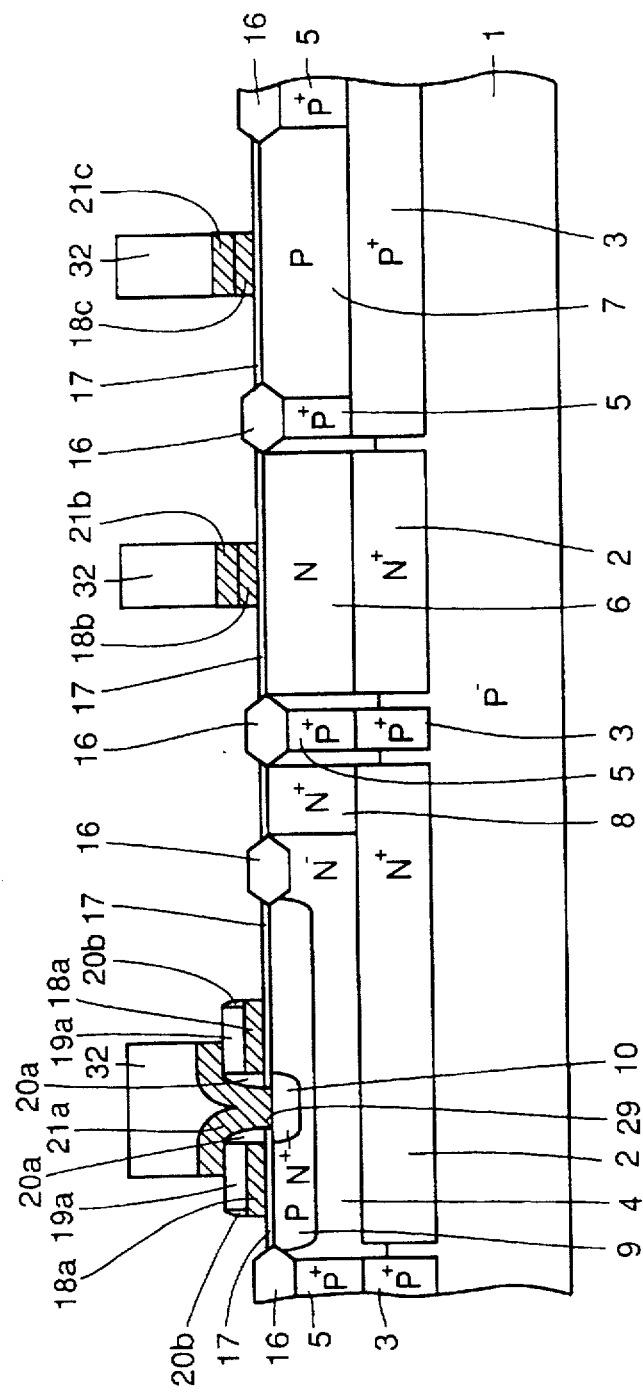

After formation of a photoresist 32 in a prescribed region of upper polycrystalline silicon layer 21 as shown in FIG. 10, upper polycrystalline silicon layer 21 and lower polycrystalline silicon layer 18 are anisotropically etched with photoresist 32 as a mask, so that lower polycrystalline silicon films 18a, 18b and 18c, and upper polycrystalline silicon films 21a, 21b, and 21c are formed as shown in FIG. 10.

Since lower polycrystalline silicon film 18a hardly includes arsenic (As) as described above, lower polycrystalline silicon film 18a substantially serves as insulating material. Accordingly, insulating material constituted of gate oxide film 17, lower polycrystalline silicon film 18a, oxide film 19a and sidewall oxide film 20a is interposed between upper polycrystalline silicon film (emitter electrode) 21a and P-type base layer 9, which considerably reduces the isolation capacitance therebetween, and thus, reduces the parasitic capacitance between the emitter and the base, compared to the conventional structure in FIG. 33. As a result, reduction in the operational speed of the NPN transistor can be prevented. After the above-described process, photoresist 32 is removed.

Figure 11:
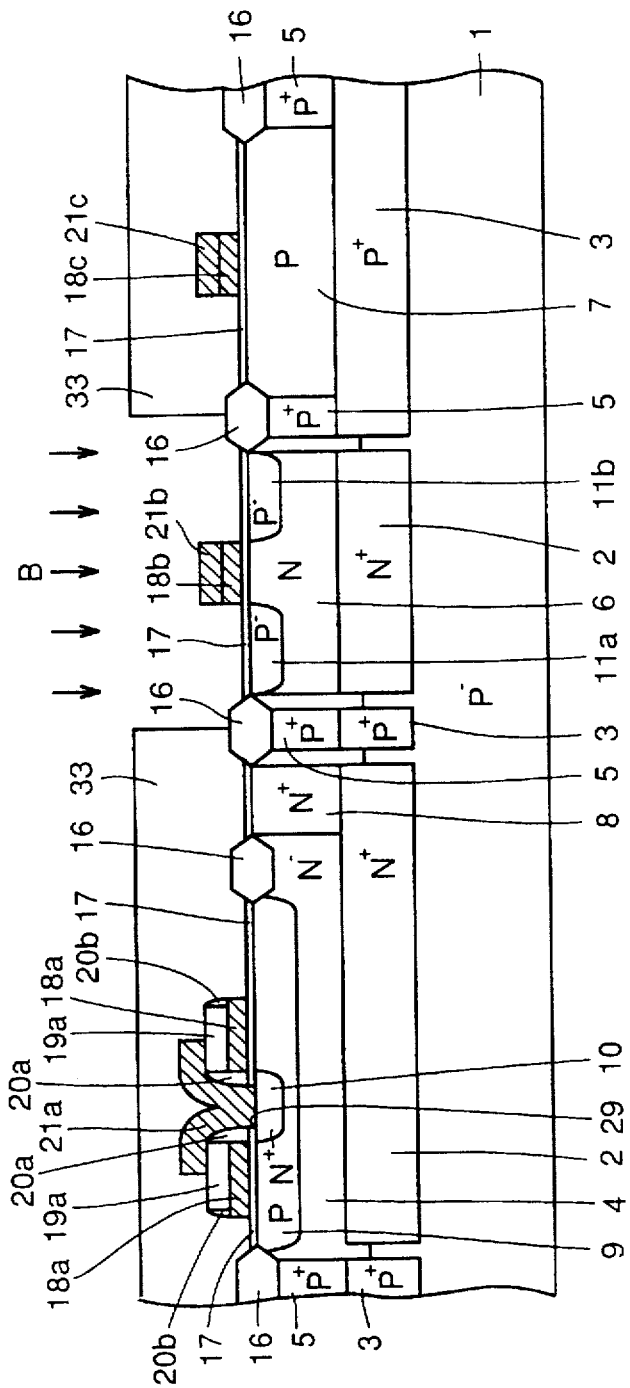

As shown in FIG. 11, a photoresist 33 is formed to cover the region other than the P-channel MOS transistor region. Boron (B) is ion-implanted with photoresist 33 as a mask, to form $P^-$ type source/drain regions 11a and 11b. Thereafter, resist 33 is removed.

Figure 12:
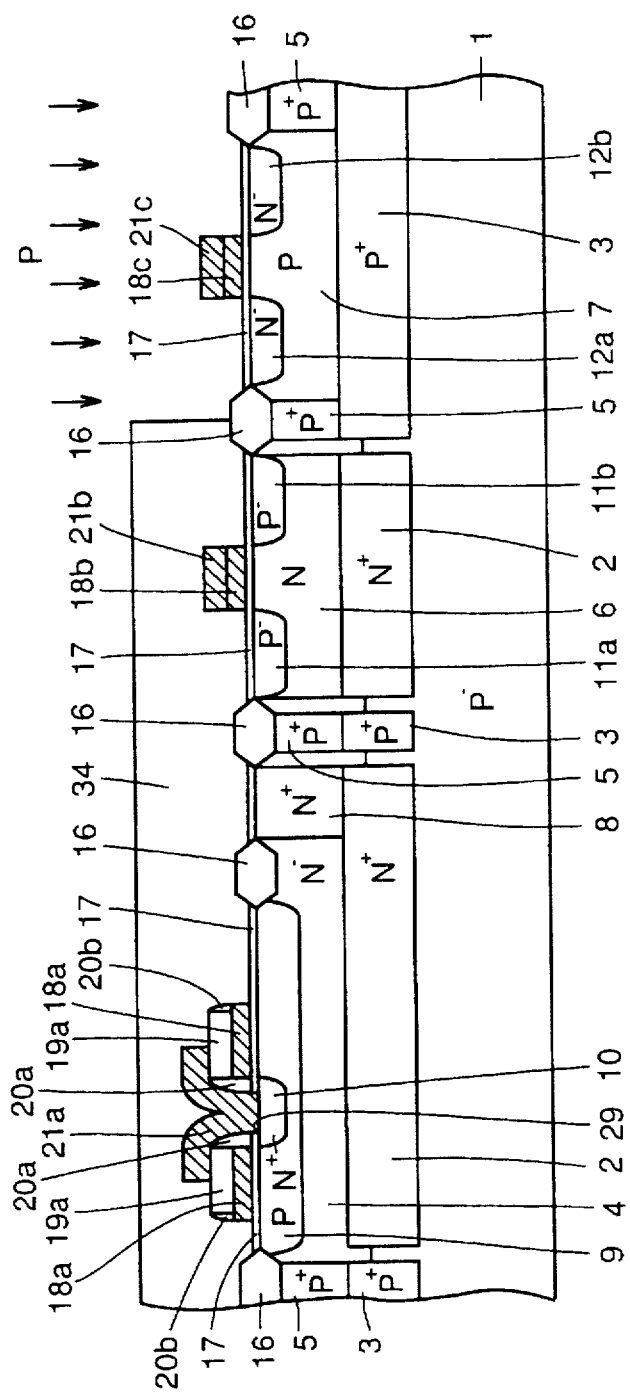
Figure 13:
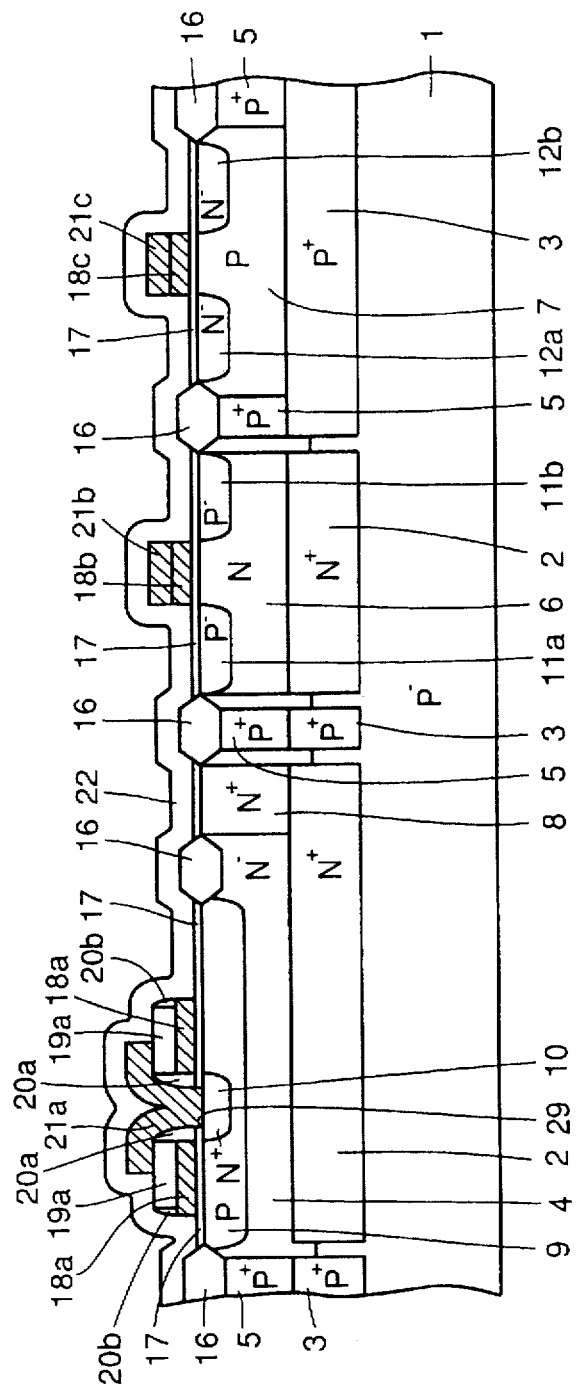
Figure 14:
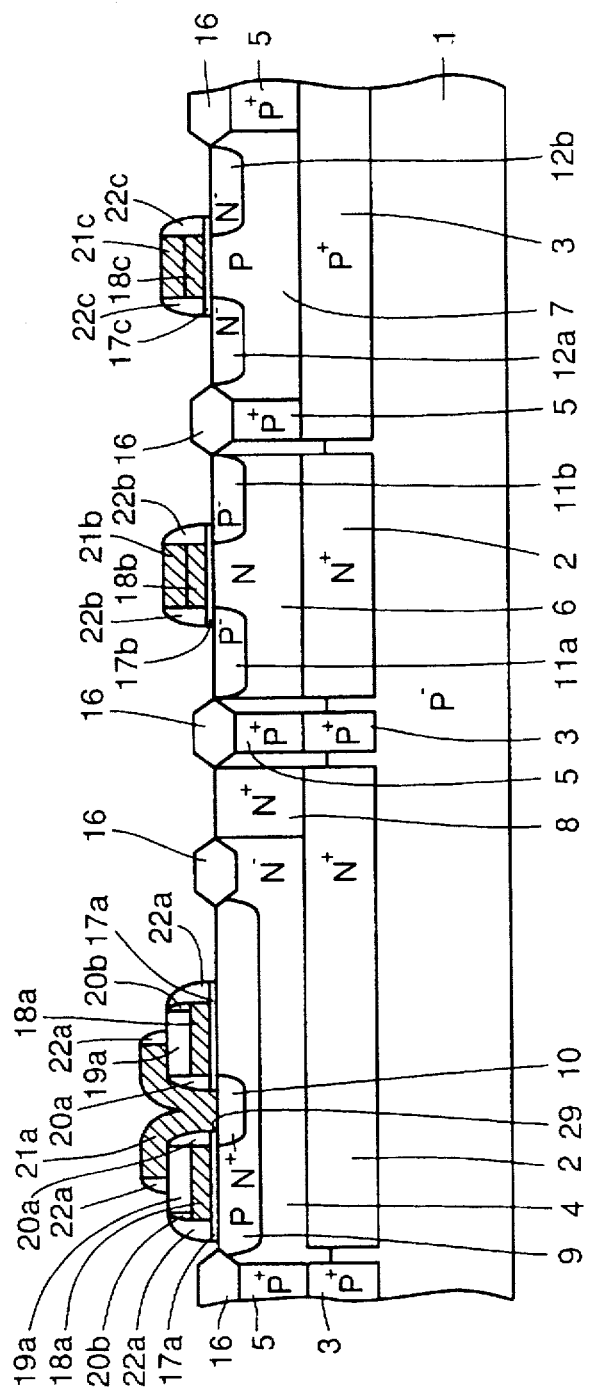

As shown in FIG. 12, a photoresist 34 is formed to cover the region other than the N-channel MOS transistor region. Phosphorus (P) is ion-implanted with photoresist 34 as a mask, to form $N^-$ source/drain regions 12a and 12b. Thereafter, resist 34 is removed. As shown in FIG. 13, an oxide film 22 having the thickness of approximately 100–150 nm is formed all over the surface with a CVD method. Then, the whole surface is anisotropically etched, so that sidewall oxide films 22a and 22b, and 22c and gate oxide films 17a, 17b and 17c are formed as shown in FIG. 14.

Figure 15:
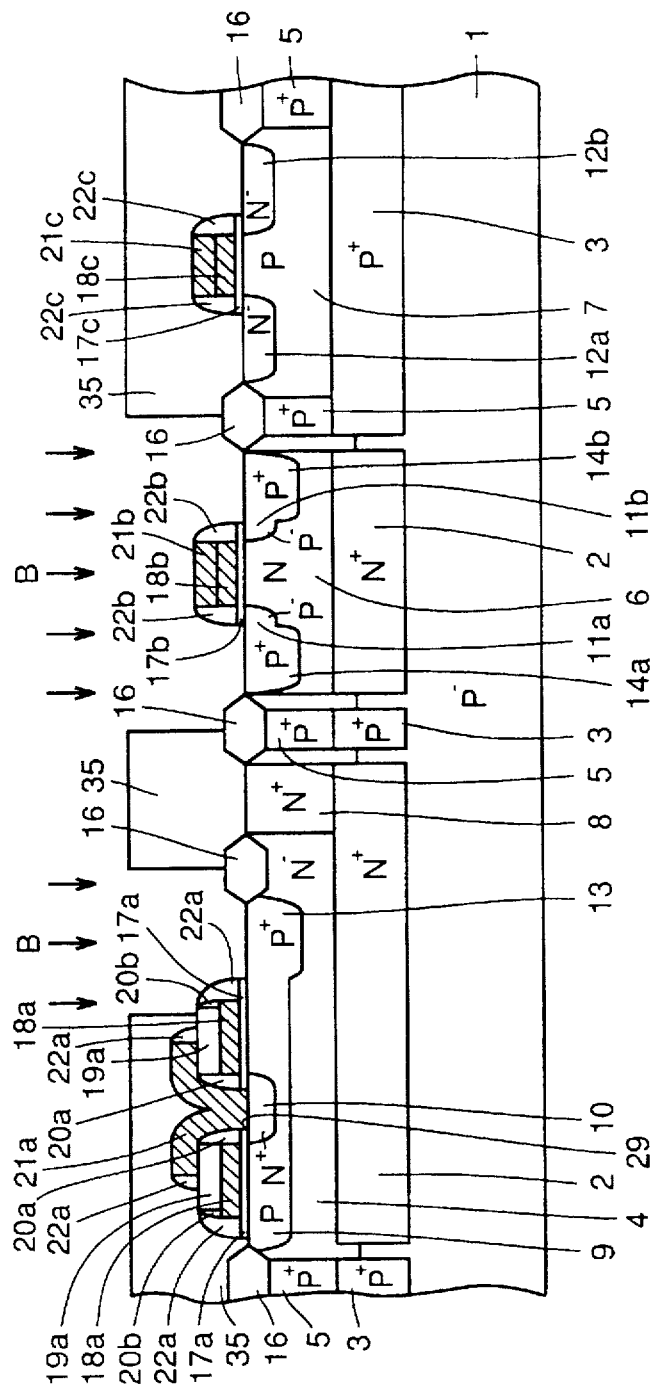

As shown in FIG. 15, a photoresist 35 is formed to cover the region other than the external base formation region and the P-channel MOS transistor region. Boron (B) is ion-implanted at a high concentration with photoresist 35 as a mask, so that $P^+$ type external base layer 13 and $P^+$ type source/drain regions 14a and 14b are formed. The end positions of $P^+$ type external base layer 13 and those of $P^+$ type source/drain regions 14a and 14b are defined respectively by isolation oxide films 16 and sidewall oxide films 22a and 22b. Thereafter resist 35 is removed.

Figure 16:
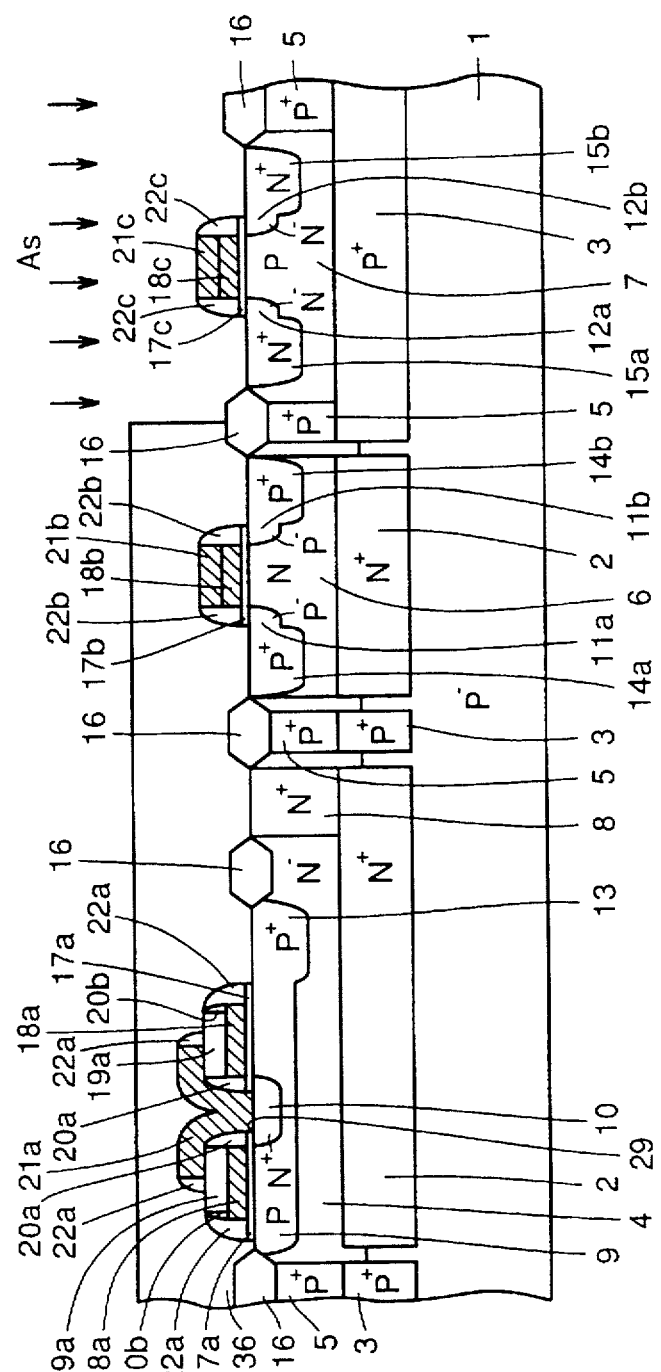

As shown FIG. 16, a photoresist 36 is formed to cover the region other than the N-channel MOS transistor formation region. Arsenic (As) is ion-implanted with high impurity concentration using photoresist 36 as a mask, so that $N^+$ type source/drain regions 15a and 15b are formed. The end positions of $N^+$ type source/drain regions 15a and 15b are defined by isolation oxide films 16 and sidewall oxide films 22c. Thereafter, photoresist 36 is removed. Then, impurities are electrically activated by heat treatment in $P^-$ type source/drain regions 11a and 11b, and $P^+$ source/drain regions 14a and 14b, and $P^+$ type external base layer 13, $N^-$ source/drain regions 12a and 12b, and $N^+$ type source/drain regions 15a and 15b.

Lastly, as shown in FIG. 1, surface protection oxide film 23 having the thickness of approximately 1000 nm is formed all over the surface by a CVD method. Contact holes are then formed in prescribed regions thereof. In the contact holes, source/drain electrode wirings 28 and a gate electrode wiring, not shown, of the N-channel MOS transistor, source/drain electrode wiring 27 and a gate electrode wiring, not shown, of the P-channel MOS transistor and collector electrode wiring 24, base electrode wiring 25 and emitter electrode wiring 26 of the bipolar transistor are formed. The semiconductor device of the first embodiment is thus completed.

While $N^+$ type emitter layer 10 is formed by diffusing arsenic (As) from upper polycrystalline silicon layer 21 in the method of manufacturing the semiconductor device in accordance with the first embodiment described above, the present invention is not limited to this, but may be performed in another method. For example, after the step shown in FIG. 4, $N^+$ type emitter layer 10 may be formed by ion-implantation of arsenic (As) through gate oxide layer 17. In this case, arsenic (As) is further introduced from upper polycrystalline silicon layer 21 into $N^+$ type emitter layer 10 in the step shown in FIG. 9. Also, after the step shown in FIG. 8, arsenic (As) ions may be implanted through emitter hole 29 and lower polycrystalline silicon layer 18, thereby forming $N^+$ type emitter layer 10, as well as providing lower polycrystalline silicon layer 18 with conductivity. Also in this case, arsenic (As) is further introduced from upper polycrystalline silicon layer 21 into N⁺ type emitter layer 10 in the step shown in FIG. 9.

Figure 17:
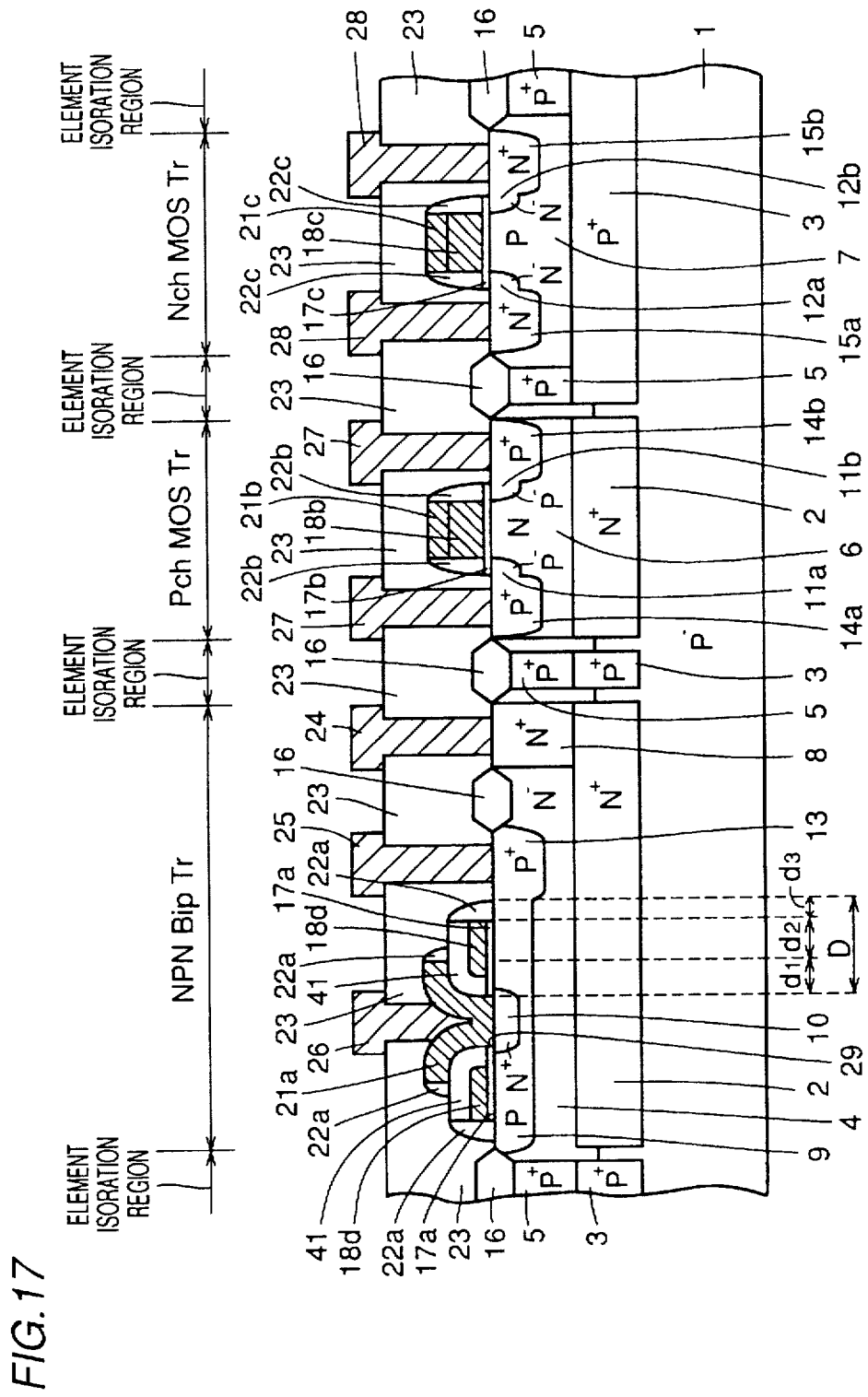
FIG. 17 is a cross sectional view showing a semiconductor device including a Bi-CMOS element in accordance with a second embodiment of the present invention.

Referring to FIG. 17, in a semiconductor device of a second embodiment, gate oxide film 17a, a lower polycrystalline silicon film 18d having insulation characteristics, and an oxide film 41 are interposed between upper polycrystalline silicon film (emitter electrode) 21a and P-type base layer 9. In other words, upper polycrystalline silicon film (emitter electrode) 21a and P-type base layer 9 are insulated by gate oxide film 17a, lower polycrystalline silicon film 18d and oxide film 41. Accordingly, also in the second embodiment, the insulation capacitance between upper polycrystalline silicon film (emitter electrode) 21a and P-type base layer 9 can be reduced compared to the conventional structure shown in FIG. 33.

Consequently, the parasitic capacitance between the emitter and the base can be reduced, whereby reduction in the operational speed of the bipolar transistor can be prevented. In order to have insulation characteristics, lower polycrystalline silicon film 18d needs only include no impurity or a slight amount of impurities.

Gate oxide film 17a has the thickness of approximately 10 nm. Lower polycrystalline silicon film 18d has the thickness of approximately 20–70 nm. Oxide film 41 has the thickness of approximately 100–150 nm.

Description will now be made on the manufacturing process of the semiconductor device in accordance with the second embodiment with reference to FIGS. 17 to 23.

Figure 18:
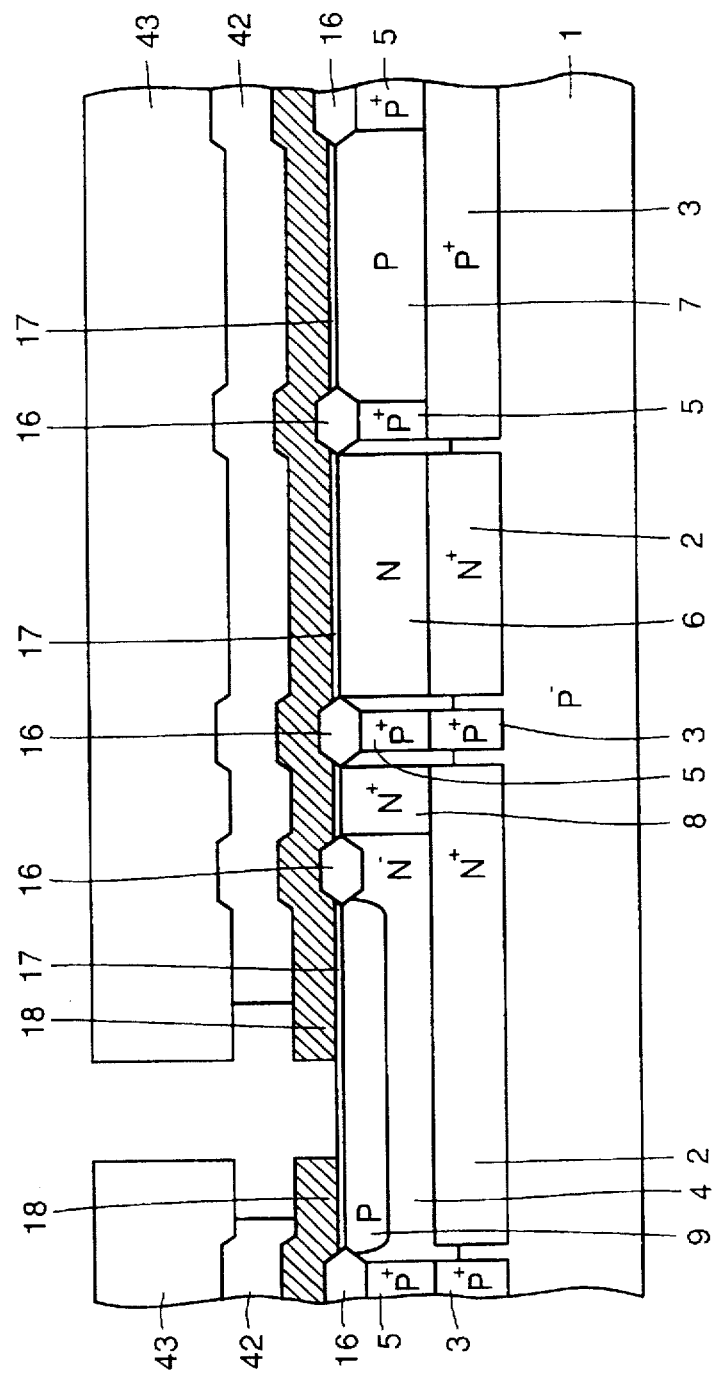
FIGS. 18 to 23 are cross sectional views showing the first to sixth steps of a manufacturing process of the semiconductor device in accordance with the second embodiment shown in FIG. 17.

Initially, with the same process as that of the manufacturing process of the semiconductor device in accordance with the first embodiment, shown in FIGS. 2 and 3, P-type base layer 9 is formed. Thereafter, gate oxide layer 17 having the thickness of approximately 10 nm is formed as shown in FIG. 18. Lower polycrystalline silicon layer 18 having the thickness of approximately 150–200 nm, and a nitride film 42 are sequentially formed on gate oxide layer 17 with a CVD method. After a photoresist 43 is formed in a prescribed region on nitride film 42, nitride film 42 is isotropically etched with photoresist 43 as a mask. Thereafter, lower polycrystalline silicon film 18 is isotropically etched with photoresist 43 as a mask, which results in a shape shown in FIG. 18. Subsequently, photoresist 43 is removed.

Figure 19:
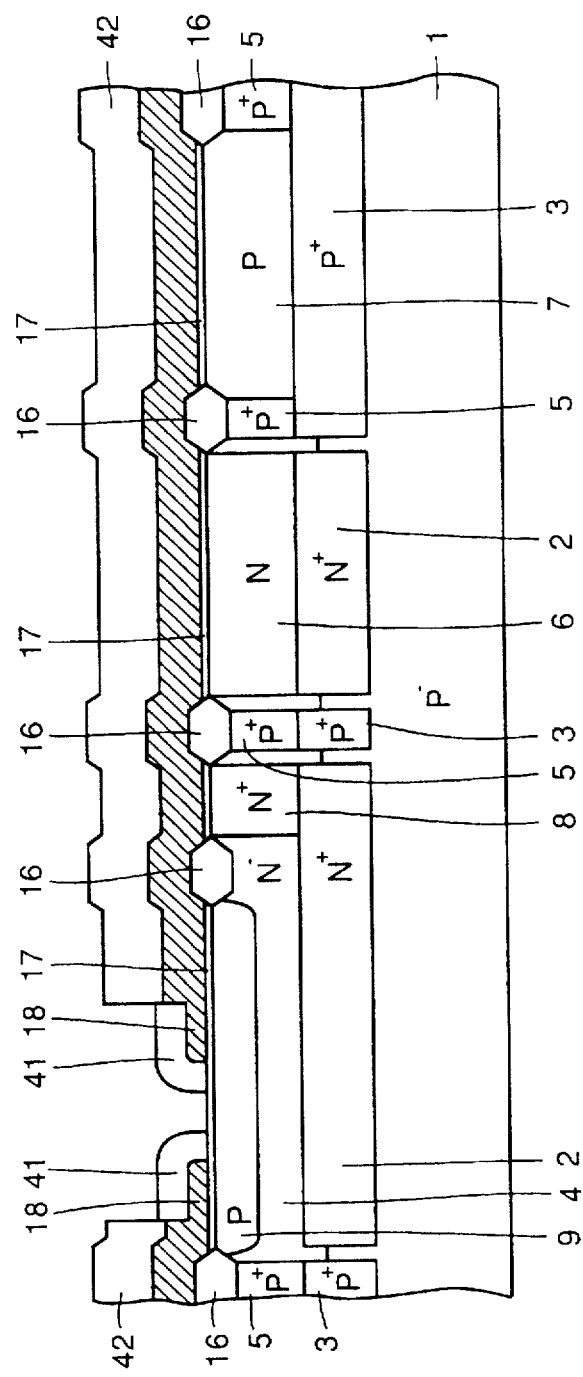
Figure 20:
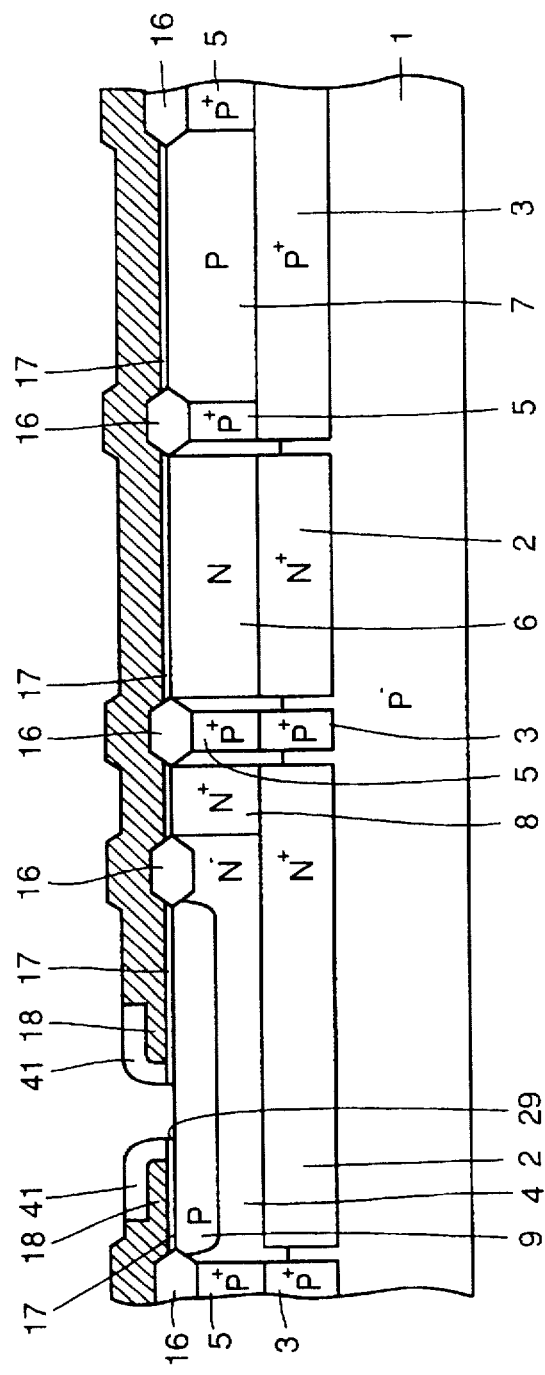

As shown in FIG. 19, the surface of lower polycrystalline silicon layer 18 is thermally oxidized with nitride film 42 as a mask, to form an oxide film 41. Thereafter, nitride film 42 is removed by wet etching with thermal phosphoric acid. The whole surface is then etched back, whereby the thickness of oxide film 41 is reduced as shown in FIG. 20, and emitter hole 29 is formed. In this etch back process, lower polycrystalline silicon layer 18 serves as a protection film for gate oxide layer 17 in the MOS transistor formation region.

Figure 21:
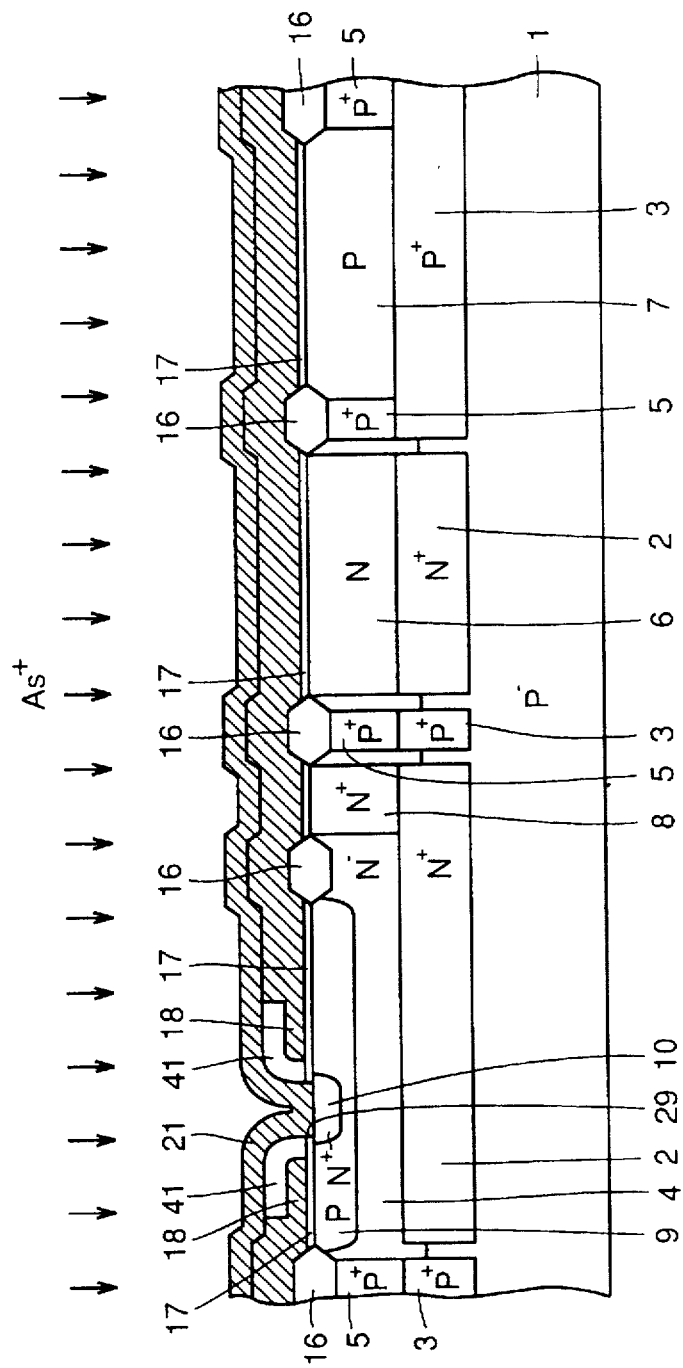

As shown in FIG. 21, upper polycrystalline silicon layer 21 having the thickness of approximately 150–200 nm is formed all over the surface with a CVD method. Arsenic (As) is ion-implanted into upper polycrystalline silicon layer 21 and lower polycrystalline silicon layer 18. Arsenic (As) within upper polycrystalline silicon film 21 is diffused in the surface region of P-type base layer 9 by heat treatment, so that N⁺ emitter layer 10 is formed.

Oxide film 41 serves as a barrier in implantation of arsenic (As). Therefore, arsenic (As) is hardly implanted into the region under oxide film 41, of lower polycrystalline silicon layer 18, which results in the same sate as insulating material.

Figure 22:
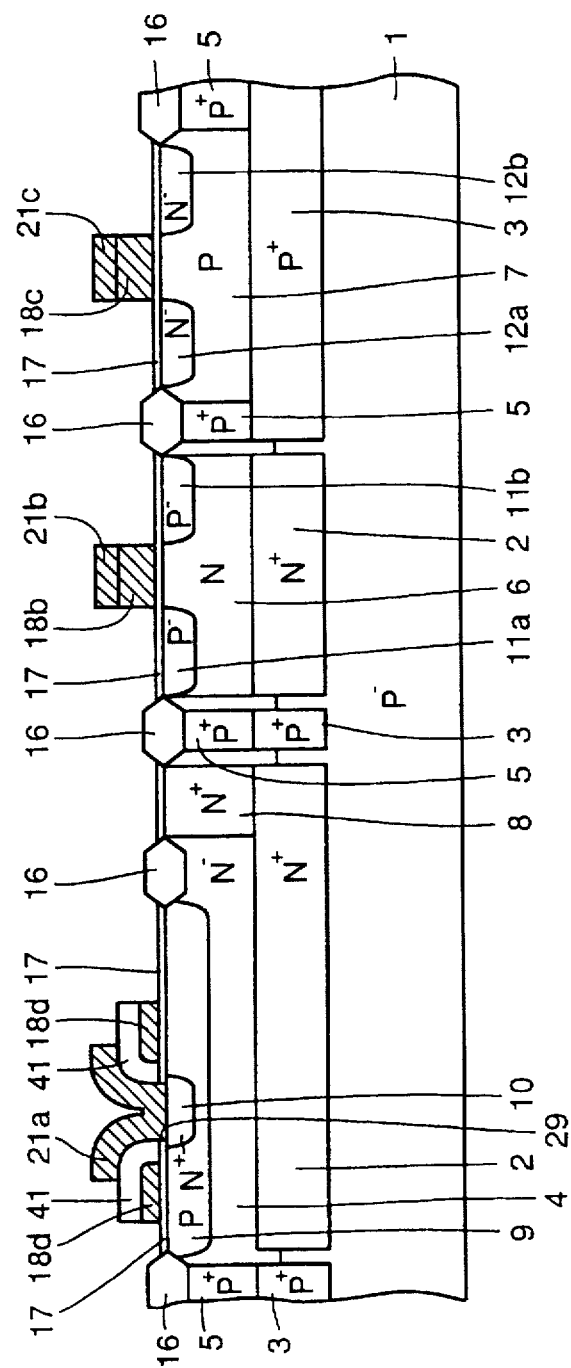
Figure 23:
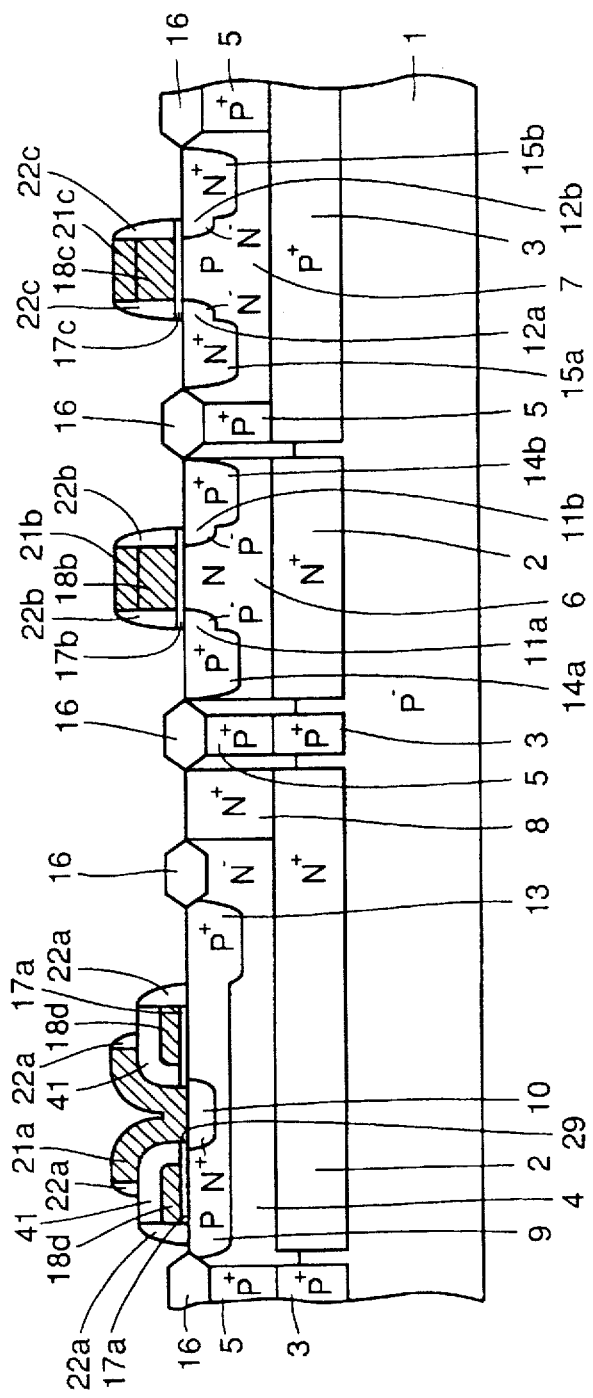

Subsequently, with the same process as that of the first embodiment shown in FIGS. 10 to 12, lower polycrystalline silicon films 18b, 18c and 18d, upper polycrystalline silicon films 21a, 21b and 21c, P⁻ type source/drain regions 11a and 11b, and N⁻ type source/drain regions 12a and 12b are formed as shown in FIG. 22. Then, with the same process as that of the first embodiment shown in FIGS. 13 to 16, sidewall oxide films 22a, and 22b and 22c, P⁺ type source/drain regions 14a and 14b, P⁺ type external base layer 13, and N⁺ type source/drain regions 15a and 15b are formed as shown in FIG. 23.

After surface protection oxide film 23 is formed to have the thickness of approximately 1000 nm and cover all over the surface, contact holes are formed in prescribed regions of surface protection oxide film 23, similarly to the process shown in FIG. 17. In the contact holes, collector electrode wiring 24, base electrode wiring 25 and emitter electrode wiring 26 of the bipolar transistor, source/drain electrode wiring 27, the gate electrode wiring, not shown, of the P-channel MOS transistor, and source/drain electrode wiring 28 and gate electrode wiring, not shown, of the N-channel MOS transistor are formed, respectively. The semiconductor device of the second embodiment is thus completed.

In the manufacturing method of the semiconductor device in accordance with the second embodiment, since formation of sidewall oxide film 20a (see FIG. 1) is not required unlike the first embodiment, the manufacturing process can be simplified.

Figure 24:
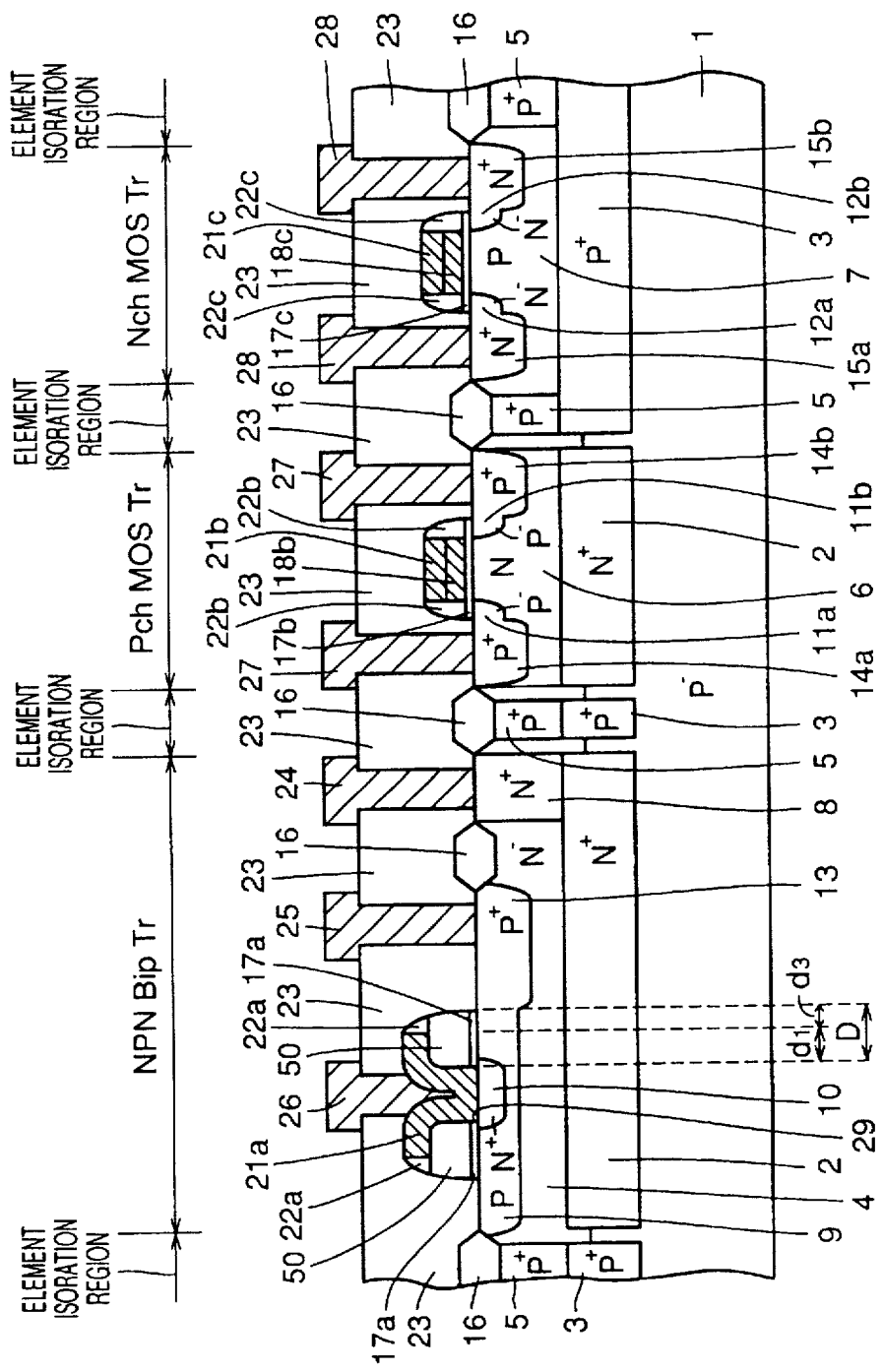
FIG. 24 is a cross sectional view showing a semiconductor device including a Bi-CMOS element in accordance with a third embodiment of the present invention.

Referring to FIG. 24, in a third embodiment, only gate oxide film 17a and an oxide film 50 are interposed between upper polycrystalline silicon film (emitter electrode) 21a and P-type base layer 9, unlike the above-described first and second embodiments. Such structure can also reduce the insulation capacitance therebetween compared to the conventional structure shown in FIG. 33. Gate oxide film 17a has the thickness of approximately 10 nm, and oxide film 50 has the thickness of approximately 160–240 nm, while upper polycrystalline silicon film 21a has the thickness of approximately 150–250 nm.

In the third embodiment, a space D between N⁺ type emitter layer 10 and P⁺ type external base layer 13 can be reduced. In the first embodiment shown in FIG. 1 and the second embodiment shown in FIG. 17, the space D between N⁺ type emitter layer 10 and P⁺ type external base layer 13 is the sum of an overlapped allowance $d_1$ of emitter hole 29 and upper polycrystalline silicon film (emitter electrode) 21a, and an overlapped allowance $d_2$ of upper polycrystalline silicon film (emitter electrode) 21a and oxide film 19a, and a width $d_3$ of sidewall oxide film 22a.

In contrast, in the third embodiment shown in FIG. 24, the space D between N⁺ type emitter layer 10 and P⁺ type external base layer 13 is the sum of the overlapped allowance $d_1$ of emitter hole 29 and upper polycrystalline silicon film (emitter electrode) 21a, and the width $d_3$ of sidewall oxide film 22a. In the third embodiment, therefore, the distance D between N⁺ type emitter layer 10 and P⁺ type external base layer 13 is reduced by $d_2$. Consequently the base area, and thus, a collector-base junction capacitance Ctc can be made smaller compared to the first and the second embodiments. As a result, the bipolar transistor can be operated at a higher speed than that in the first and second embodiments.

One example of the manufacturing process of the semiconductor device in accordance with the third embodiment will now be described with reference to FIGS. 24 to 29.

Figure 25:
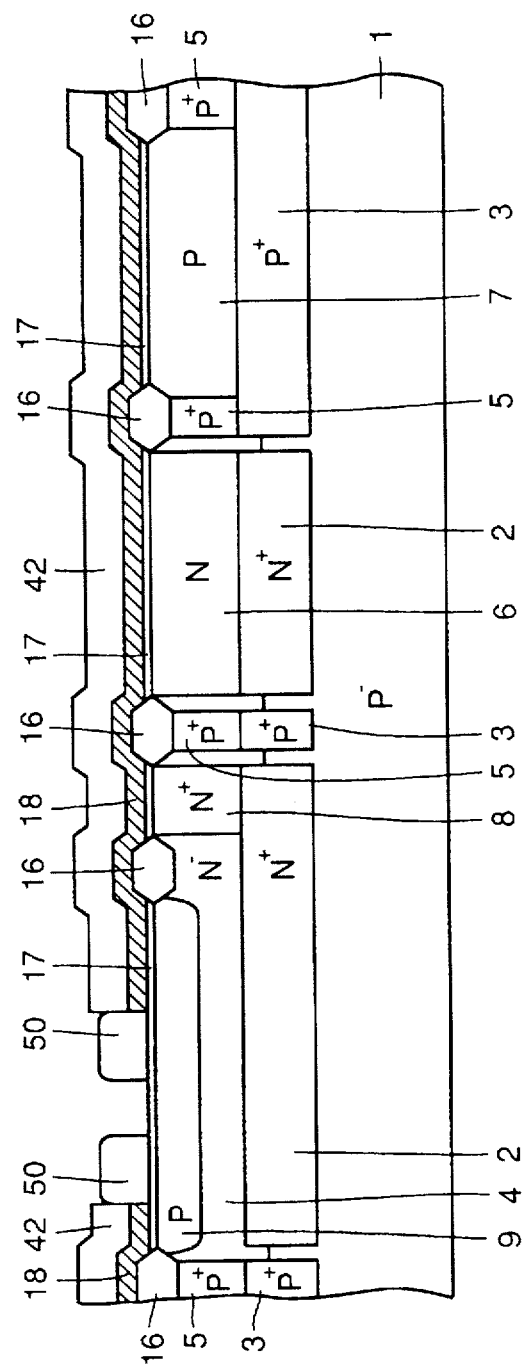
FIGS. 25 to 29 are cross sectional views showing the first to fifth steps of one example of a manufacturing process of the semiconductor device in accordance with the third embodiment shown in FIG. 24.

Initially, with the same process as that of the second embodiment described with reference to FIG. 18, gate oxide layer 17, lower polycrystalline silicon layer 18, and nitride film 42 are formed as shown in FIG. 18. Thereafter, photoresist 43 is removed. All of the exposed portion of lower polycrystalline silicon layer 18 is oxidized with nitride film 42 as a mask, so that oxide film 50 is formed to have the thickness of approximately 160–240 nm as shown in FIG. 25.

Figure 26:
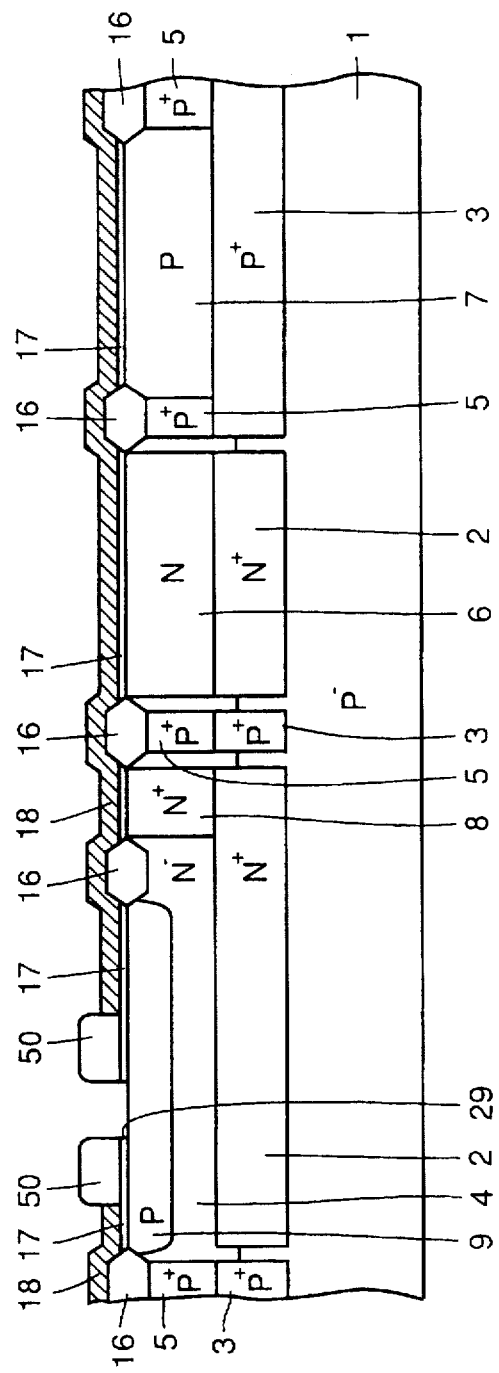

In order to facilitate formation of oxide film 50, it is preferable to employ a polycrystalline silicon film having a high oxidation speed, as lower polycrystalline silicon film 18. Specifically, a polycrystalline silicon film with phosphorus (P) doped at the impurity concentration of approximately $5 \times 10^{20}$ cm$^3$ is preferable. Thereafter, nitride film 42 is removed by wet etching. The whole surface is then etched back to form emitter hole 29 in gate oxide layer 17 as shown in FIG. 26. In this etch back, oxide film 50 is also etched by approximately 10 nm in thickness, so that the thickness thereof is finally 150–230 nm, approximately.

Figure 27:
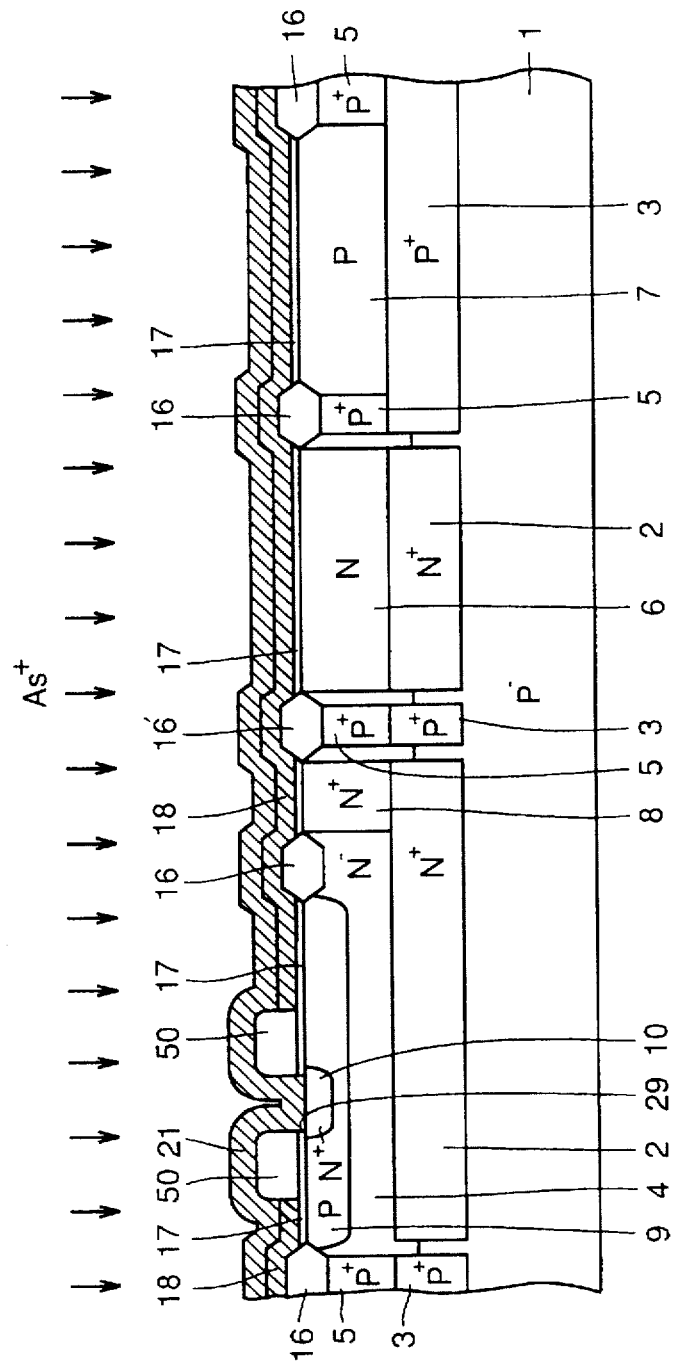
Figure 28:
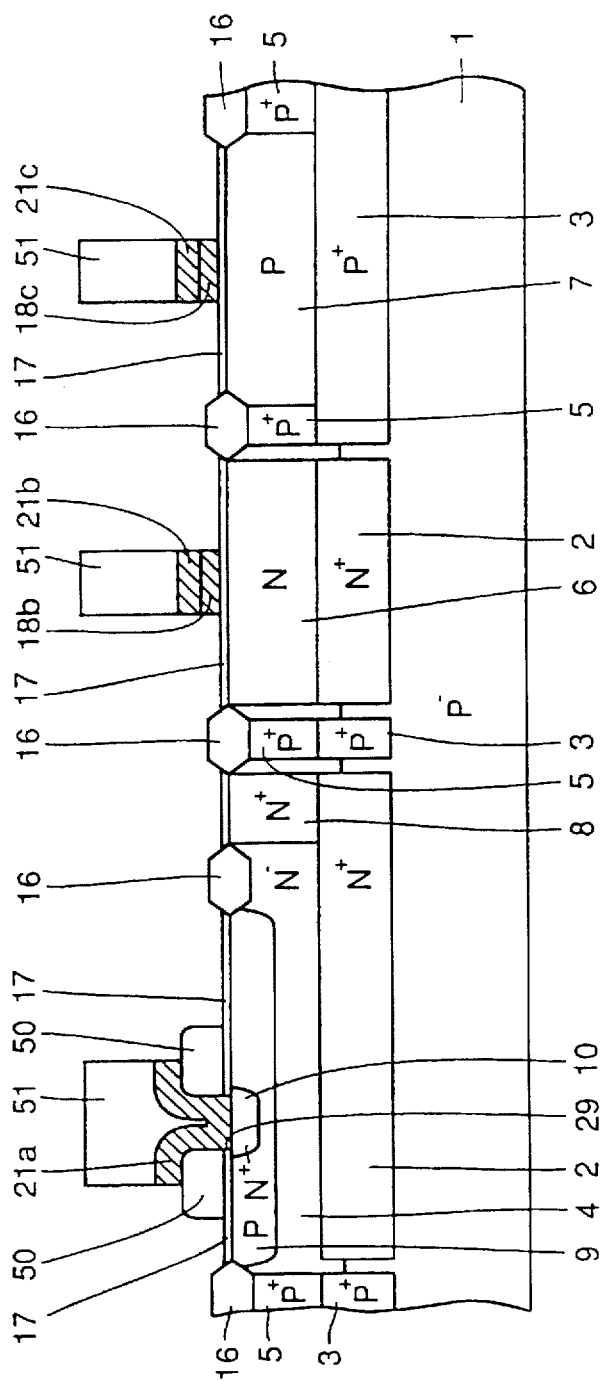

As shown in FIG. 27, upper polycrystalline silicon layer 21 is formed all over the surface to have the thickness of approximately 150–200 nm with a CVD method. After ion-implantation of arsenic (As), upper polycrystalline silicon layer 21 and lower polycrystalline silicon layer 18 are heat-treated, so that arsenic (As) in upper polycrystalline silicon layer 21 is diffused in the surface of P-type base layer 9, to form N$^+$ type emitter layer 10. After forming a photoresist 51 in a prescribed region on upper polycrystalline silicon layer 21 as shown in FIG. 28, upper polycrystalline silicon layer 21 and lower polycrystalline silicon layer 18 are anisotropically etched with photoresist 51 as a mask, so that lower polycrystalline silicon films 18b and 18c, and upper polycrystalline silicon films 21a, 21b and 21c are formed as shown in FIG. 28.

An end of the upper polycrystalline silicon film (emitter electrode) 21a of the NPN bipolar transistor region is defined to be located on the upper surface of oxide film 50, whereby lower polycrystalline silicon layer 18 of the NPN bipolar transistor region can be removed. As a result, lower polycrystalline silicon layer 18 is left only as the gate electrodes of the MOS transistors. Thereafter, photoresist 51 is removed. With the same process as that of the first embodiment shown in FIGS. 11 and 12, P$^-$ type source/drain regions 11a and 11b, and N$^-$ type source/drain regions 12a and 12b are formed.

Figure 29:
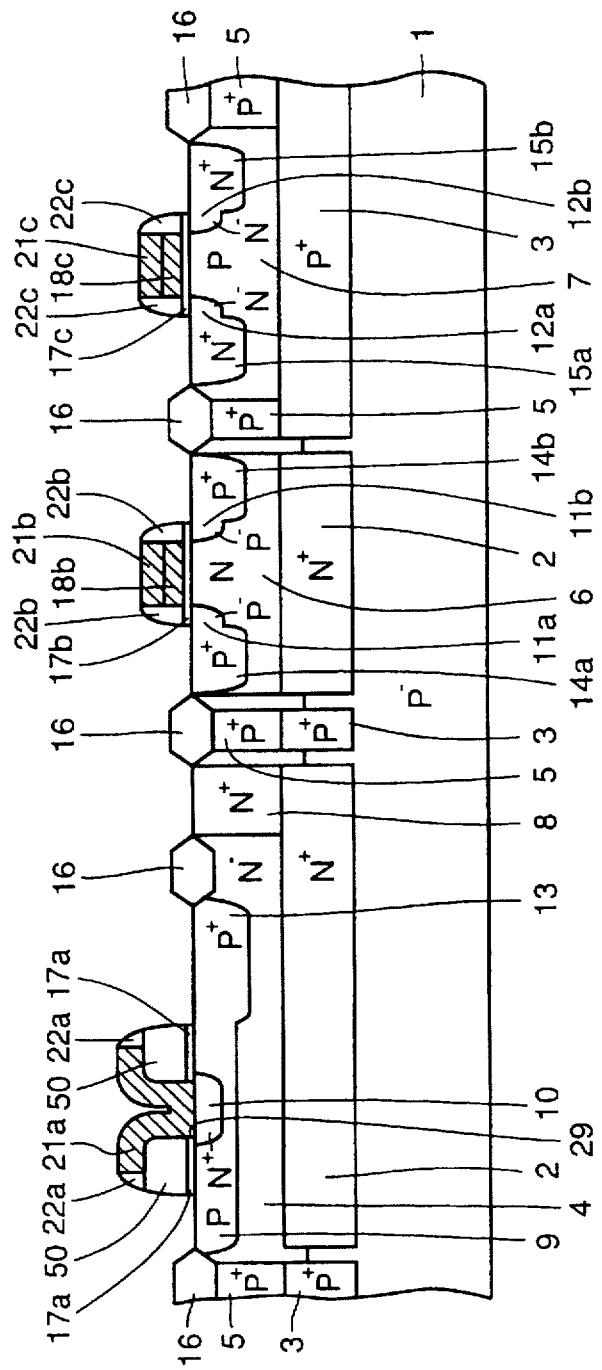

With the same process as that of the first embodiment shown in FIGS. 13 to 16, sidewall oxide films 22a, 22b and 22c, P$^+$ type external base layer 13, P$^+$ type source/drain regions 14a and 14b and N$^+$ type source/drain regions 15a and 15b are formed as shown in FIG. 29.

Finally, as shown in FIG. 24, after forming surface protection oxide film 23 all over the surface, contact holes are formed in prescribed regions of surface protection oxide film 23. In the respective contact holes, collector electrode wiring 24, base electrode wiring 25, and emitter electrode wiring 26 of the bipolar transistor, source/drain electrode wiring 27 and a gate electrode wiring, not shown, of the P-channel MOS transistor, and source/drain electrode wiring 28 and the gate electrode wiring, not shown, of the N-channel MOS transistor are formed. The semiconductor device in accordance with the third embodiment is thus completed.

Another example of the manufacturing process of the semiconductor device in accordance with the third embodiment will be described with reference to FIG. 24 and FIGS. 30 to 32.

Figure 30:
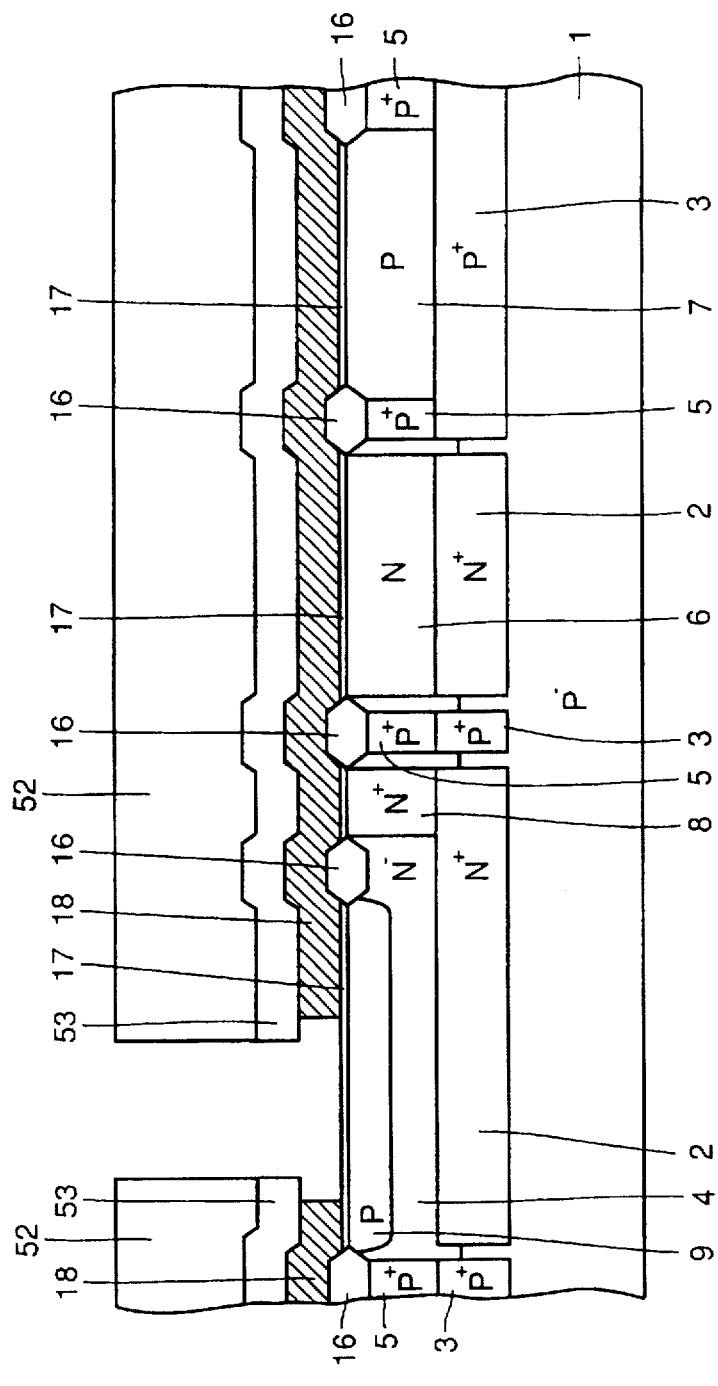
FIGS. 30 to 32 are cross sectional views showing the first to third steps of another example of the manufacturing process of the semiconductor device in accordance with the third embodiment shown in FIG. 24.

The same process up to formation of P-type base layer 9 as that of the first embodiment shown in FIGS. 2 and 3 is carried out. Subsequently, as shown in FIG. 30, gate oxide layer 17 is formed all over the surface to have the thickness of approximately 10 nm, with a thermal oxidation method. After forming a lower polycrystalline silicon layer, not shown, having the thickness of approximately 150–230 nm and an oxide film, not shown, on the whole surface of gate oxide layer 17 with a CVD method, a photoresist 52 is formed in a prescribed region on the oxide film. The oxide film is isotropically etched with photoresist 52 as a mask, and the polycrystalline silicon layer thereunder is isotropically etched, so that lower polycrystalline silicon layer 18 and an oxide film 53 as shown in FIG. 30 are formed. Thereafter, photoresist 52 is removed.

Figure 31:
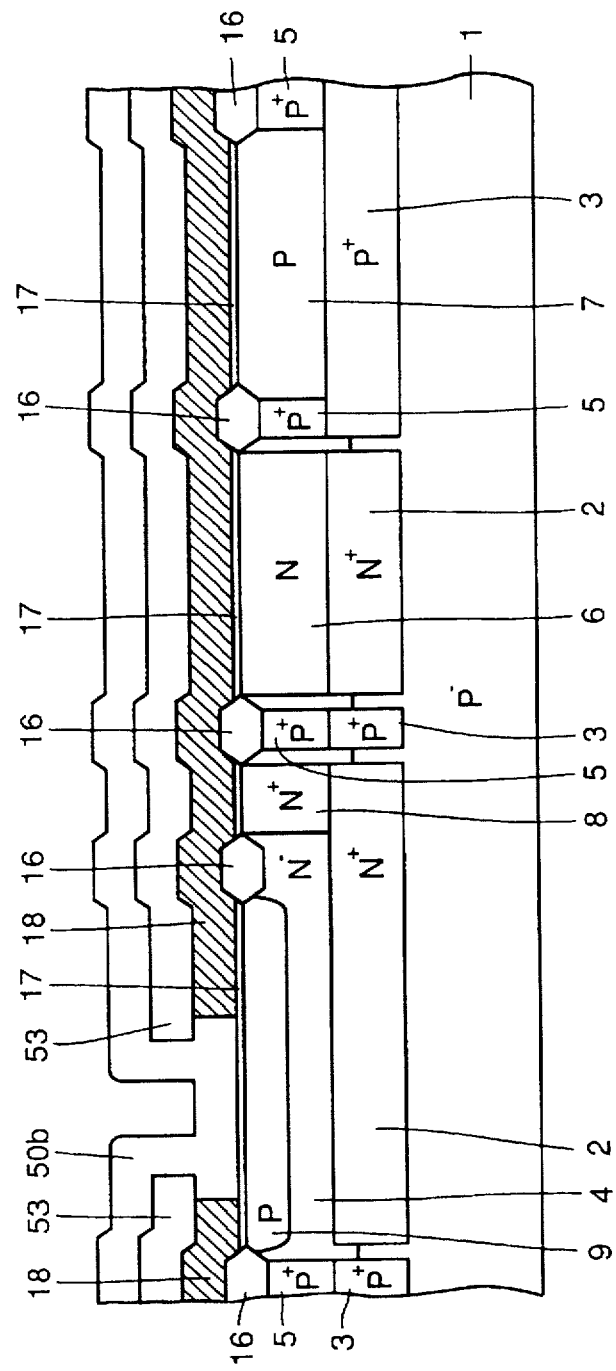
Figure 32:
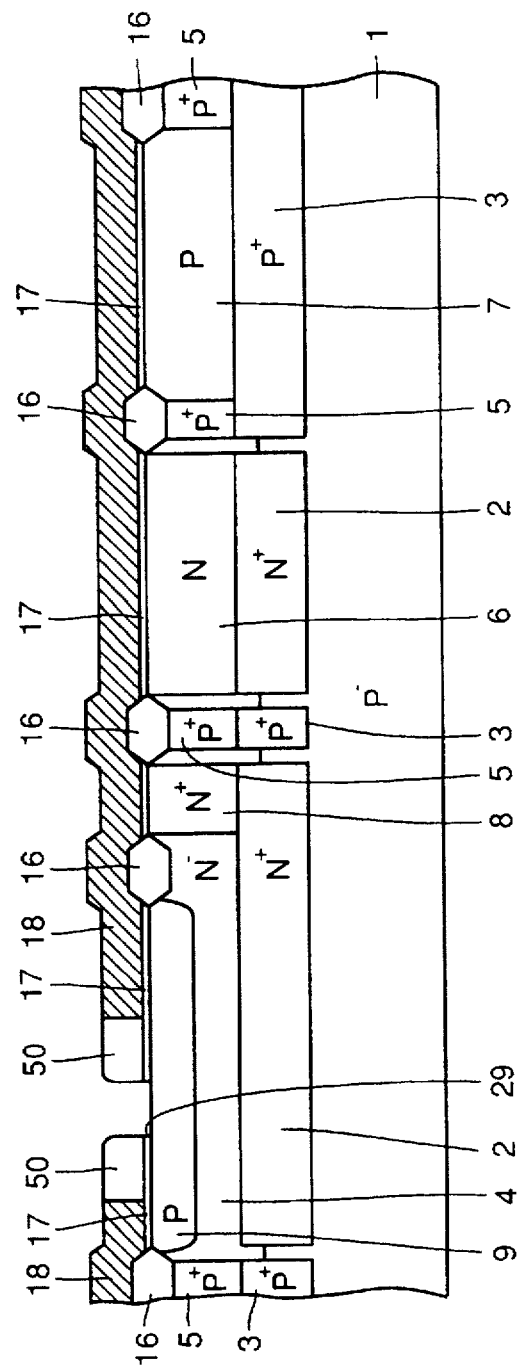

As shown in FIG. 31, an oxide film 50b is formed with a CVD method. Oxide film 50b is formed to fill also the region where lower polycrystalline silicon film 18 has been removed. Oxide films 50b and 53, and gate oxide layer 17 are etched back, so that oxide film 50 and gate oxide layer 17 as shown in FIG. 32 are formed.

Through the same process as that of the one example of the manufacturing process of the semiconductor device in accordance with the third embodiment shown in FIGS. 27 to 29, the semiconductor device of the third embodiment shown in FIG. 24 is completed. In the process shown in FIGS. 30 to 32, lower polycrystalline silicon layer 18 is formed to have the same thickness as that of oxide film 50. Accordingly, lower polycrystalline silicon layer 18 has the larger thickness than that by the manufacturing process shown in FIGS. 25 to 29. It should be noticed that the larger thickness of lower polycrystalline silicon layer 18 introduces no problem on element characteristics, just causing the larger thickness of the gate electrode of the MOS transistor.

Additionally, in the manufacturing process shown in FIGS. 30 to 32, the following advantage is provided because oxide film 50 is not formed by a thermal oxidation method unlike in the manufacturing process described with reference to FIGS. 25 to 29. Specifically, in the manufacturing process shown in FIGS. 25 to 29, a possibility of oxidation of the surface of P-type base layer 9 exists in thermal oxidation of oxide film 50 (see FIG. 25). In this case, the depth of base layer 9 might be reduced, which results in reduction of the breakdown voltage of the bipolar transistor. To the contrary, in the manufacturing process shown in FIGS. 30 to 32, formation of oxide film by a CVD method can prevent such disadvantage.

As described above, in the semiconductor device according to the one aspect of the present invention, the first insulating layer, the semiconductor layer, and the second insulating layer are interposed between the base layer and the emitter electrode. This reduces the insulation capacitance between the base layer and the emitter electrode, and thus, the parasitic capacitance between the base and the emitter, compared to the conventional structure with only one insulating layer interposed therebetween. Consequently, reduction in the operational speed of the element can be effectively prevented. The insulation capacitance between the base layer and the emitter electrode can be further reduced by forming the above semiconductor layer so as to have insulation characteristics.

In the semiconductor device according to the another aspect of the present invention, the first insulating layer and the second insulating layer are interposed between the base layer and the emitter electrode. This reduces the insulation capacitance between the base layer and the emitter electrode, and thus, the parasitic capacitance between the emitter and the base, compared to the conventional structure with only one insulating layer interposed therebetween. Consequently, reduction in the operational speed of the element can be effectively prevented.

In the semiconductor device according to the still another aspect of the present invention, the first insulating layer having approximately the same thickness as that of the gate insulating film of the complementary field effect transistor, the semiconductor layer, and the second insulating layer interposed between the base layer and the emitter electrode constituting the bipolar transistor. This reduces the insulation capacitance between the base layer and the emitter electrode, and thus, the parasitic capacitance between the emitter and the base, compared to the conventional structure with only the above first insulating layer interposed therebetween. Consequently, reduction in the operational speed of the bipolar transistor can be prevented. The insulating capacitance can be further reduced between the base layer and the emitter electrode by forming the above semiconductor layer so as to have insulation characteristics.

In the semiconductor device according to the further aspect of the present invention, the first insulating layer having approximately the same thickness as that of the gate insulating film constituting the complementary field effect transistor, and the second insulating layer are interposed between the base layer and the emitter electrode constituting the bipolar transistor. This reduces the insulation capacitance between the base layer and the emitter electrode, and thus, the parasitic capacitance between the base and the emitter, compared to the conventional structure with only the above first insulating layer interposed between the base layer and the emitter electrode. Consequently, reduction in the operational speed of the bipolar transistor can be prevented.

In the method of manufacturing the semiconductor device according to the still further aspect of the present invention, the first insulating layer is formed on the base layer; the semiconductor layer is formed on the first insulating layer; the second insulating layer is formed on the upper surface and side surface of the semiconductor layer; and the emitter electrode is formed extending on and along the surface of the second insulating layer, whereby the structure is formed wherein the first insulating layer, the semiconductor layer and the second insulating layer are interposed between the emitter electrode and the base layer. Such structure enables the insulation capacitance between the emitter electrode and the base layer to be reduced, compared to the structure with only one insulating layer is interposed therebetween. Consequently, a semiconductor device with a reduced parasitic capacitance between the emitter and the base can be readily formed.

In the method of manufacturing the semiconductor device according to the still further aspect of the present invention, the first insulating layer is formed on the base layer; the second insulating layer is formed on the first insulating layer; and the emitter electrode is formed on the second insulating layer, whereby the structure is formed wherein the first insulating layer and the second insulating layer are interposed between the base layer and the emitter electrode. Such structure enables the insulation capacitance between the base layer and the emitter electrode to be reduced compared to the conventional structure with only one insulating layer interposed therebetween. Consequently, a semiconductor device with a reduced parasitic capacitance between the emitter and the base can be readily manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device, including:
   a collector region of a first conductivity type having a main surface;
   a base region of a second conductivity type formed in a prescribed region on the main surface of said collector region;
   an emitter region of the first conductivity type formed in a prescribed region on a main surface of said base region;
   a first insulating layer formed at least in a prescribed region on said base region, and having an opening on said emitter region;
   a semiconductor layer formed on said first insulating layer;
   a second insulating layer formed on an upper surface and a side surface of said semiconductor layer, said second insulating layer having a thickness of at least ten times a thickness of said first insulating layer; and
   an emitter electrode formed electrically connected to said emitter region within said opening, and extending on and along a surface of said second insulating layer, wherein
   said semiconductor layer substantially serves as an insulating material.

2. The semiconductor device according to claim 1, wherein
   said second insulating layer includes an upper insulating layer formed on the upper surface of said semiconductor layer, and
   a sidewall insulating film formed on the side surface of said semiconductor layer and a side surface of said upper insulating layer.

3. The semiconductor device according to claim 1, wherein
   said first insulating layer has a thickness of about 10 nm,
   said semiconductor layer has a thickness of about 20 to about 70 nm, and
   said second insulating layer has a thickness of about 100 to about 150 nm.

4. The semiconductor device according to claim 1, wherein
   a side end of said emitter electrode is located on a region forming said semiconductor layer.

5. A semiconductor device, including:
   a collector region of a first conductivity type having a main surface;
   a base region of a second conductivity type formed in a prescribed region on the main surface of said collector region;
   an emitter region of the first conductivity type formed in a prescribed region on a main surface of said base region;
   a first insulating layer formed at least in a prescribed region on said base region, and having an opening on said emitter region;
   a semiconductor layer formed on said first insulating layer;
   a second insulating layer formed on an upper surface and a side surface of said semiconductor layer, said second 5,731,617

19 insulating layer having a thickness of at least ten times a thickness of said first insulating layer;

an emitter electrode formed electrically connected to said emitter region within said opening, and extending on and along a surface of and in direct contact with said second insulating layer, wherein:

said semiconductor layer substantially serves as an insulating material; and a side end of said emitter electrode extends over a portion of said semiconductor layer; and further comprising:

a third insulating layer formed to cover said emitter electrode, and having a contact hole on said emitter electrode; and an emitter electrode wiring layer connected to said emitter electrode within the contact hole of said third insulating layer.

6. A semiconductor device comprising:

a collector region of a first conductivity type having a main surface;

a base region of a second conductivity type formed in a prescribed region on the main surface of said collector region;

an emitter region of the first conductivity type formed in a prescribed region on a main surface of said base region;

a first insulating layer having an upper surface and being formed of a thermal oxide layer at least in a prescribed region on said base region, and having an opening on said emitter region;

a second insulating layer having an upper surface and formed directly on said upper surface of said first insulating layer, said second insulating layer having a thickness of at least ten times a thickness of said first insulating layer, and an opening on the emitter region;

an emitter electrode formed electrically connected to said emitter region within said opening, and extending on and in direct contact with said upper surface of said second insulating layer, a third insulating layer formed to cover said emitter electrode, and having an opening in a prescribed region on said emitter electrode, and an emitter electrode wiring layer formed electrically connected to said emitter electrode within the opening of said third insulating layer.

7. The semiconductor device according to claim 6, wherein said first insulating layer has a thickness of about 10 nm, and said second insulating layer has a thickness of about 150 to about 230 nm.

8. The semiconductor device according to claim 6, wherein a side end of said emitter electrode is located on and within a region forming said second insulating layer.

9. The semiconductor device according to claim 6, wherein said first insulating layer has a substantially rectangular shape.

10. A semiconductor device including a field effect transistor and a bipolar transistor, wherein said field effect transistor includes:

a pair of source/drain regions formed in a main surface of a semiconductor substrate; and a gate electrode having a lower layer and an upper layer formed on the main surface of said semiconductor

20 substrate with a gate insulating film interposed between said pair of source/drain regions;

said bipolar transistor includes:

a collector region of a first conductivity type formed in the main surface of said semiconductor substrate;

a base region of a second conductivity type formed in a prescribed region of said collector region;

an emitter region of the first conductivity type formed in a prescribed region of said base region;

a first insulating layer formed at least in a prescribed region on said base region, having an opening on said emitter region, and having the same thickness as that of said gate insulating film;

a semiconductor layer formed on said first insulating layer and formed of the same layer as said lower layer;

a second insulating layer formed on an upper surface and a side surface of said semiconductor layer; and an emitter electrode formed electrically connected to said emitter region within said opening, and formed of the same layer as said upper layer, said emitter electrode extending on and along a surface of said second insulating layer.

11. The semiconductor device according to claim 10, wherein said semiconductor layer has insulation characteristics.

12. The semiconductor device according to claim 10, wherein both of said gate insulating film and said first insulating layer have a thickness of about 10 nm, said semiconductor layer has a thickness of about 20 to about 70 nm, and said second insulating layer has a thickness of about 100 to about 150 nm.

13. The semiconductor device according to claim 10, wherein a side end of said emitter electrode is located on and within a region forming said second insulating layer.

14. A semiconductor device including a field effect transistor and a bipolar transistor, wherein said field effect transistor includes:

a pair of source/drain regions formed in a main surface of a semiconductor substrate; and a gate electrode formed on the main surface of said semiconductor substrate with a gate insulating film interposed therebetween; and said bipolar transistor includes:

a collector region of a first conductivity type having a main surface;

a base region of a second conductivity type formed in a prescribed region in the main surface of said collector region;

an emitter region of the first conductivity type formed in a prescribed region on a main surface of said base region;

a first insulating layer having an upper surface and being formed of a thermal oxide layer at least in a prescribed region on said base region, having an opening on said emitter region, and having the same thickness as that of said gate insulating film;

a second insulating layer having an upper surface and formed entirely and directly on said upper surface of said first insulating layer, said second insulating layer having a thickness of at least ten times the thickness of said first insulating layer, and an opening on the emitter region;

an emitter electrode formed electrically connected to said emitter region within said opening, and extending on and in direct contact with said upper surface of said second insulating layer, a third insulating layer formed to cover said emitter electrode, and having an opening in a prescribed region on said emitter electrode, and an emitter electrode wiring layer formed electrically connected to said emitter electrode within the opening of said third insulating layer.

15. The semiconductor device according to claim 14, wherein a side end of said emitter electrode extends over a portion of said second insulating layer.

16. The semiconductor device according to claim 14, wherein both of said gate insulating film and said first insulating layer have a thickness of about 10 nm, and said second insulating layer has a thickness of about 150 to about 230 nm.

* * * * *